United States Patent
Beck et al.

(10) Patent No.: US 12,341,507 B2
(45) Date of Patent: Jun. 24, 2025

(54) SUPERCONDUCTING MULTI-WAY SWITCHES

(71) Applicant: International Business Machines Corporation, Armonk, NY (US)

(72) Inventors: Matthew Beck, Danbury, CT (US); Santino Carnevale, Stamford, CT (US); Marco Turchetti, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 18/475,368

(22) Filed: Sep. 27, 2023

(65) Prior Publication Data

US 2025/0105841 A1    Mar. 27, 2025

(51) Int. Cl.
*H03K 17/92*    (2006.01)
*H03H 7/38*    (2006.01)

(52) U.S. Cl.
CPC .............. *H03K 17/92* (2013.01); *H03H 7/38* (2013.01)

(58) Field of Classification Search
CPC .................................................. H03K 17/92
USPC ....................................................... 327/527
See application file for complete search history.

(56) References Cited

U.S. PATENT DOCUMENTS

| | | | |
|---|---|---|---|
| 9,929,978 B2 | 3/2018 | Naaman | |
| 10,262,276 B2 | 4/2019 | Puri et al. | |
| 10,546,621 B2 | 1/2020 | Murduck et al. | |
| 10,581,394 B2 | 3/2020 | Abdo | |
| 10,833,383 B2 | 11/2020 | Abdo | |
| 11,430,831 B2 | 8/2022 | Gumann et al. | |
| 11,431,322 B2 | 8/2022 | Keane | |
| 11,569,821 B2 | 1/2023 | Braun et al. | |
| 2010/0176840 A1 | 7/2010 | Bedard | |
| 2021/0265964 A1 | 8/2021 | Miano et al. | |
| 2023/0128586 A1* | 4/2023 | Graninger | H03K 17/10 327/367 |
| 2023/0163762 A1 | 5/2023 | Yamaji et al. | |

FOREIGN PATENT DOCUMENTS

WO    2017062143 A1    4/2017

OTHER PUBLICATIONS

O. Naaman et al., "On-Chip Josephson Junction Microwave Switch," arXiv:1512.01484v1, Dec. 7, 2015, 10 pages.

(Continued)

*Primary Examiner* — Tomi Skibinski
(74) *Attorney, Agent, or Firm* — Erik Johnson; Ryan, Mason & Lewis, LLP

(57) ABSTRACT

A device comprises a switch circuit and control lines. The switch circuit comprises a plurality of signal input/output ports, and a plurality of switch nodes, each switch node comprising a superconducting loop which comprises a plurality of Josephson junctions arranged in a ring configuration. The control lines are configured to selectively apply flux bias control signals to the switch nodes. The plurality of switch nodes is arranged to selectively configure a signal routing path between any pairwise combination of signal input/output ports of the plurality of signal input/output ports, in response to flux bias control signals selectively applied to the switch nodes.

20 Claims, 11 Drawing Sheets

(56) References Cited

OTHER PUBLICATIONS

T.-C. Chien et al., "Multiparametric Amplication and Qubit Measurement with a Kerr-free Josephson Ring Modulator," arXiv:1903.02102v3, Dec. 20, 2019, 13 pages.
S. Wolter et al., "Static and Dynamic Transport Properties of Multi-Terminal, Multi-Junction MicroSQUIDs Realized with Nb/HfTi/Nb Josephson Junctions," Superconductor Science and Technology, Jul. 5, 2022, 14 pages, vol. 35.
M. I. Faley et al., "A Self-Flux-Biased NanoSQUID with Four NbN—TiN—NbN Nanobridge Josephson Junctions," Electronics, May 27, 2022, 12 pages, vol. 11, No. 1704.
T. Roy et al., "Implementation of Pairwise Longitudinal Coupling in a Three-Qubit Superconducting Circuit," arXiv:1610.07915v1, Oct. 26, 20216, 16 pages.
T. Roy et al., "A Programmable Three-Qubit Superconducting Processor with All-to-All Connectivity," arXiv:1809.00668v1, Sep. 5, 2018, 11 pages.

* cited by examiner

100

| Signal Path | PORTS | Flux_A | Flux_B | Flux_C | Flux_D | Flux_E |
|---|---|---|---|---|---|---|
| 1 | $P_1 \leftrightarrow P_2$ | 0 | 1 | 1 | 0 | 0 |
| 2 | $P_1 \leftrightarrow P_3$ | 1 | 0 | 0 | 1 | 0 |
| 3 | $P_1 \leftrightarrow P_4$ | 0 | 1 | 0 | 0 | 1 |
| 4 | $P_2 \leftrightarrow P_3$ | 0 | 1 | 0 | 1 | 0 |
| 5 | $P_2 \leftrightarrow P_4$ | 1 | 0 | 0 | 0 | 1 |
| 6 | $P_3 \leftrightarrow P_4$ | 1 | 1 | 0 | 0 | 0 |

200

300

400

500

600

610

620

SUPERCONDUCTING MULTI-WAY SWITCHES

BACKGROUND

This disclosure relates generally to quantum computing and, in particular, microwave switch circuits and microwave signal routing techniques for use with, e.g., superconducting quantum computing systems. A quantum computing system can be implemented using superconducting circuit quantum electrodynamics (cQED) architectures that are constructed using quantum circuit components such as, e.g., superconducting quantum bits and other types of superconducting quantum devices that are controlled using microwave control signals. In general, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures.

The cryogenic hardware that is utilized to implement a quantum computer with superconducting qubits requires a variety of microwave components including, e.g., qubit couplers, microwave filters, quantum limited amplifiers, Josephson parametric frequency converters and mixers, isolators, and other microwave components that are implemented in qubit control and readout signal paths etc., which are controlled using various microwave control signals (e.g., radio frequency (RF) control pulses, RF pump signals, etc.). The cryogenic hardware is disposed on a base stage (e.g., millikelvin (mK) stage) of a dilution refrigerator, wherein microwave control signals generated by room temperature (300 K) electronics are transmitted via high bandwidth lines that extend from the room temperature electronics through the dilution refrigerator to the cryogenic hardware in the base stage.

The transmission and delivery of microwave control signals in a superconducting quantum computing system is typically performed in a coarse manner where, for example, individual superconducting qubits and other quantum devices are controlled by independent stand-alone microwave drive lines. As the number of superconducting quantum devices scales, however, the number of high-bandwidth control lines for transmitting microwave control signals from the room temperature electronics to the mK stage of the dilution refrigerator scales linearly as a function of quantum device count. As a consequence, the increasing number of high-bandwidth control lines that must extend through the dilution refrigerator to support the increasing number of quantum devices to be controlled poses a limitation to quantum system scaling and integration.

SUMMARY

Exemplary embodiments of the disclosure include superconducting switch circuitry and techniques for delivery and transmission of microwave control signals in quantum computing systems. For example, an exemplary embodiment includes a device which comprises a switch circuit and control lines. The switch circuit comprises a plurality of signal input/output ports, and a plurality of switch nodes. Each switch node comprises a superconducting loop which comprises a plurality of Josephson junctions arranged in a ring configuration. The control lines are configured to selectively apply flux bias control signals to the switch nodes. The plurality of switch nodes is arranged to selectively configure a signal routing path between any pairwise combination of signal input/output ports of the plurality of signal input/output ports, in response to flux bias control signals selectively applied to the switch nodes.

Advantageously, the superconducting switch circuit provides fast switching speeds (e.g., nanosecond switching speeds) and extremely low or substantially zero power dissipation, for implementing all-to-all switch circuit to route signals between different channels. Indeed, the all-to-all switch circuit can be selectively configured to transmit high-bandwidth signals between any pairwise combination of signal input/output ports of the switch circuit. In the context of a quantum computing system, the ability to selectively route high-bandwidth signals between a myriad of signal input and output ports of a switch circuit with all-to-all connectivity allows for, e.g., a significant reduction in the number of high bandwidth wires for transmitting signals between room temperature (e.g., 300 K) electronics and quantum devices in a cryogenic environment (e.g., mK stage) of a dilution refrigerator.

Another exemplary embodiment includes a device which comprises a plurality of switch circuits, and a plurality of control lines coupled to the switch circuits, wherein at least a subset of the control lines is commonly coupled to each switch circuit of the plurality of switch circuits. Each switch circuit comprises a plurality of signal input/output ports, and a plurality of switch nodes, wherein each switch node comprises a superconducting loop which comprises a plurality of Josephson junctions arranged in a ring configuration, and wherein the plurality of switch nodes is arranged to selectively configure a signal routing path between any pairwise combination of signal input/output ports of the plurality of signal input/output ports, in response to flux bias control signals selectively applied to the switch nodes by the control lines.

Another exemplary embodiment includes a system which comprises a quantum processor, a switch circuit, and a control system. The quantum processor comprises superconducting quantum devices. The switch circuit is coupled to at least some of the superconducting quantum devices. The control system is coupled to the switch circuit by control lines, and configured to control operation of the switch circuit to route a microwave signal to a given superconducting quantum device coupled to the switch circuit. The switch circuit comprises a plurality of signal input/output ports, and a plurality of switch nodes. Each switch node comprises a superconducting loop which comprises a plurality of Josephson junctions arranged in a ring configuration. The plurality of switch nodes is arranged to selectively configure a signal routing path between any pairwise combination of signal input/output ports of the plurality of signal input/output ports, in response to flux bias control signals on the control lines, which are selectively applied to the switch nodes by the control system.

In another exemplary embodiment, as may be combined with the preceding paragraphs, an impedance matching network is integrated with the switch circuit.

In another exemplary embodiment, as may be combined with the preceding paragraphs, the impedance matching network comprises a plurality of immittance inverting multipole bandpass filters, wherein each immittance inverting multipole bandpass filter is disposed in a respective signal routing path between a respective pairwise combination of the signal input/output ports.

Other embodiments will be described in the following detailed description of exemplary embodiments, which is to be read in conjunction with the accompanying figures.

DETAILED DESCRIPTION

Exemplary embodiments of the disclosure will now be described in further detail with regard to superconducting switching circuitry and techniques for delivery and transmission of microwave control signals in quantum computing systems. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting quantum devices (e.g., quantum processors, quantum bits, Josephson junction devices, Josephson ring modulators, quantum-limited amplifiers (QLAs), qubit couplers, microwave switches, isolator circuits, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figures 1A, 1B:
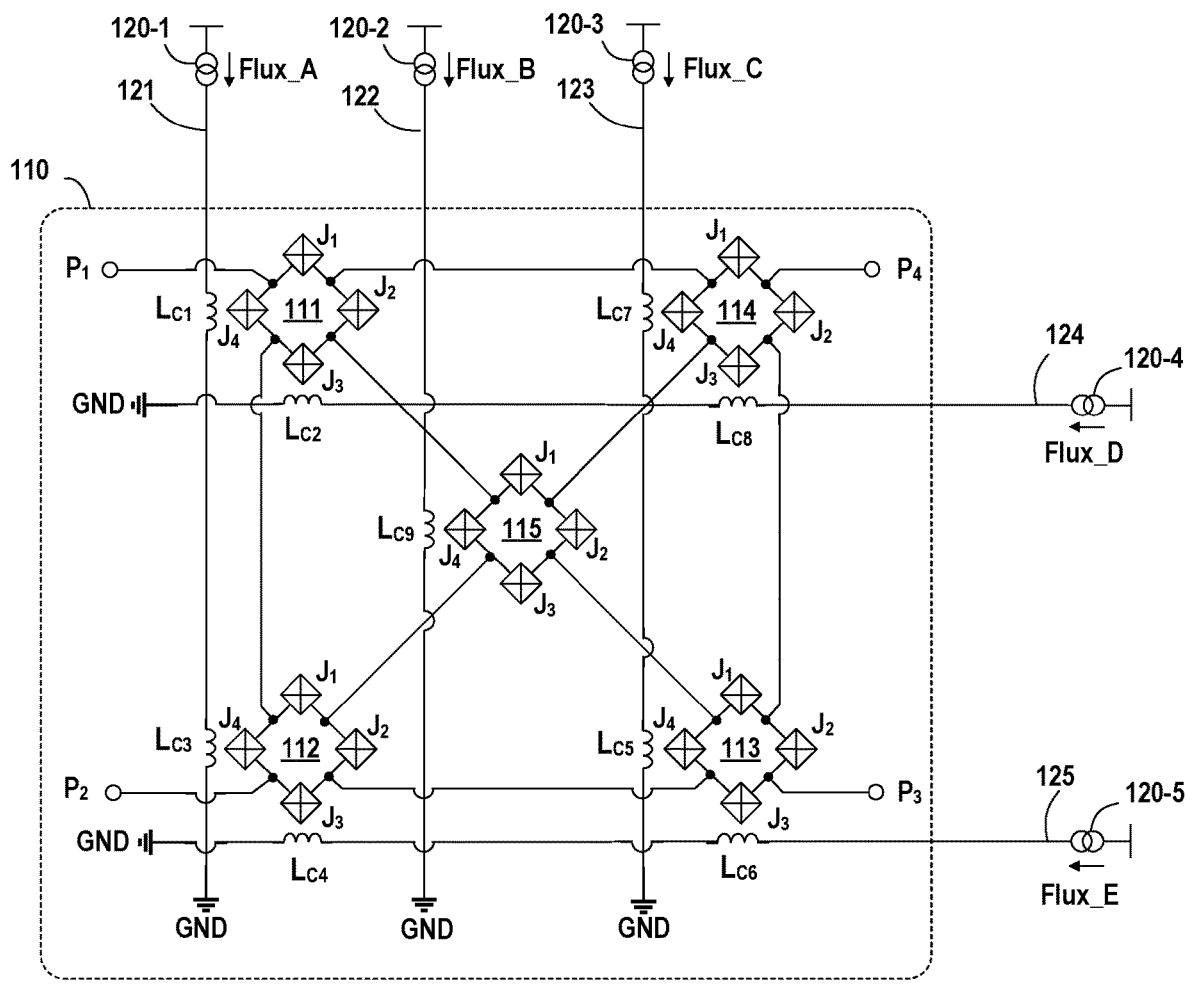
FIG. 1A schematically illustrates signal switching circuitry, according to an exemplary embodiment of the disclosure.
FIG. 1B illustrates a state diagram which shows signal routing paths of a switch circuit of the signal switching circuitry of FIG. 1A, which can be selectively configured using flux bias control signals, according to an exemplary embodiment of the disclosure.

FIG. 1A schematically illustrates signal switching circuitry according to an exemplary embodiment of the disclosure. In particular, FIG. 1A schematically illustrates an exemplary embodiment of signal switching circuitry 100 which comprises a superconducting multi-way reciprocal switch circuit 110 (or simply, switch circuit 110), and a plurality of flux signal generators 120-1, 120-2, 120-3, 120-4, and 120-5 (collectively, flux signal generators 120). The switch circuit 110 is a multi-port device comprising a plurality of input/output (I/O) ports, wherein the I/O ports comprise a first port $P_1$, a second port $P_2$, a third port $P_3$, and a fourth port $P_4$. The switch circuit 110 comprises a plurality of switch nodes including a first switch node 111, a second switch node 112, a third switch node 113, a fourth switch node 114, and a fifth switch node 115. In an exemplary embodiment, each switch node 111, 112, 113, 114, and 115 comprises a superconducting loop which comprises a plurality of Josephson junctions arranged in a ring configuration. For example, as shown in FIG. 1A, each switch node 111, 112, 113, 114, and 115 comprises a superconducting loop formed by four (4) Josephson junctions $J_1$, $J_2$, $J_3$, and $J_4$ arranged in a loop configuration. In this regard, in an exemplary embodiment, each switch node 111, 112, 113, 114, and 115 comprises a Joseophson ring modulator (JRM) or a four-Josephson junction DC superconducting quantum interference device (DC-SQUID).

As explained in further detail below, each switch node 111, 112, 113, 114, and 115 forms a superconducting loop through which a magnetic flux (D can be threaded to selectively place the switch nodes 111, 112, 113, 114, and 115 into one to two different states (e.g., a high impedance state or a low impedance state) to selectively route RF signals between the different ports $P_1$, $P_2$, $P_3$, and $P_4$. The plurality of switch nodes 111, 112, 113, 114, and 115 are arranged in a switch matrix configuration (e.g., all-to-all switch matrix configuration) to selectively configure a signal routing path between any pairwise combination of the I/O ports $P_1$, $P_2$, $P_3$, and $P_4$, at a given time, by selectively applying flux bias control signals to switch nodes 111, 112, 113, 114, and 115 via a time-domain multiplexing control process.

As schematically illustrated in FIG. 1A, the first switch node 111 and the second switch node 112 are serially coupled in a signal routing path between the first port $P_1$ and the second port $P_2$. The first switch node 111, the fifth switch node 115, and the third switch node 113 are serially coupled in a signal routing path between the first port $P_1$ and the third port $P_3$. The second switch node 112, the fifth switch node 115, and the fourth switch node 114 are serially coupled in a signal routing path between the second port $P_2$ and the fourth port $P_4$. The third switch node 113 and the fourth switch node 114 are serially coupled in a signal routing path between the third port $P_3$ and the fourth port $P_4$. In an exemplary embodiment, the switch nodes 111, 112, 113, 114, and 115 have the same circuit architecture and operating characteristics/parameters.

Further, the switch circuit 110 comprises a plurality of inductors $L_{C1}$-$L_{C9}$ (alternatively, coupling inductors) that are configured to mutually couple flux bias signals to the switch nodes 111, 112, 113, 114, and 115, as desired, to selectively route RF signals between the ports $P_1$, $P_2$, $P_3$, and $P_4$. As schematically illustrated in FIG. 1A, the coupling inductors $L_{C1}$ and $L_{C2}$ are disposed adjacent to the first switch node 111. The coupling inductors $L_{C3}$ and $L_{C4}$ are disposed adjacent to the second switch node 112. The coupling inductors $L_{C5}$ and $L_{C6}$ are disposed adjacent to the third switch node 113. The coupling inductors $L_{C7}$ and $L_{C8}$ are disposed adjacent to the fourth switch node 114. The coupling inductor $L_{C9}$ is disposed adjacent to the fifth switch node 115. In an exemplary embodiment, the coupling inductors $L_{C1}$-$L_{C9}$ are designed to have the same planar architecture and inductance value.

The flux signal generators 120-1, 120-2, 120-3, 120-4, and 120-5 are configured to generate respective flux bias control signals Flux_A, Flux_B, Flux_C, Flux_D, and Flux_E, which are applied to respective flux bias control lines 121, 122, 123, 124, and 125. As schematically illustrated in FIG. 1A, the flux bias control line 121 is coupled to and between the flux signal generator 120-1 and a ground node GND, and comprises the coupling inductors $L_{C1}$ and $L_{C3}$. The flux bias control line 122 is coupled to and between the flux signal generator 120-2 and the ground node GND, and comprises the coupling inductor $L_{C9}$. The flux bias control line 123 is coupled to and between the flux signal generator 120-3 and the ground node GND, and comprises the coupling inductors $L_{C5}$ and $L_{C7}$. The flux bias control line 124 is coupled to and between the flux signal generator 120-4 and the ground node GND, and comprises the coupling inductors $L_{C2}$ and $L_{C8}$. The flux bias control line 125 is coupled to and between the flux signal generator 120-5 and the ground node GND, and comprises the coupling inductors $L_{C4}$ and $L_{C6}$.

In response the flux signal generator 120-1 applying a flux bias control signal Flux_A to the flux bias control line 121, the inductor $L_{C1}$ will generate a magnetic flux which threads through the superconducting loop of the first switch node 111, and the inductor $L_{C3}$ will generate a magnetic flux which threads through the superconducting loop of the second switch node 112. Moreover, in response to the flux signal generator 120-2 applying a flux bias control signal Flux_B to the flux bias control line 122, the inductor $L_{C9}$ will generate a magnetic flux which threads through the superconducting loop of the fifth switch node 115. Further, in response the flux signal generator 120-3 applying a flux bias control signal Flux_C to the flux bias control line 123, the inductor $L_{C5}$ will generate a magnetic flux which threads through the superconducting loop of the third switch node 113, and the inductor $L_{C7}$ will generate a magnetic flux which threads through the superconducting loop of the fourth switch node 114.

Similarly, in response the flux signal generator 120-4 applying a flux bias control signal Flux_D to the flux bias control line 124, the inductor $L_{C2}$ will generate a magnetic flux which threads through the superconducting loop of the first switch node 111, and the inductor $L_{C8}$ will generate a magnetic flux which threads through the superconducting loop of the fourth switch node 114. Moreover, in response the flux signal generator 120-5 applying a flux bias control signal Flux_E to the flux bias control line 125, the inductor $L_{C4}$ will generate a magnetic flux which threads through the superconducting loop of the second switch node 112, and the inductor $L_{C6}$ will generate a magnetic flux which threads through the superconducting loop of the third switch node 113.

The switch circuit 110 comprises a reciprocal signal routing and switching architecture in which an RF signal that is input to one port (e.g., $P_1$) can be routed to any other port (e.g., $P_2$, $P_3$, and $P_4$) by selectively generating and applying one or more of the flux bias control signals Flux_A, Flux_B, Flux_C, Flux_D, and/or Flux_E to the respective flux bias control lines 121, 122, 123, 124, and 125. For example, FIG. 1B illustrates a state diagram which shows a plurality of signal routing paths (e.g., six signal paths) that are obtained between ports of the switch circuit 110 based on different states of the flux bias control signals Flux_A, Flux_B, Flux_C, Flux_D, and Flux_E, that are applied to the switch circuit 110, according to an exemplary embodiment of the disclosure. In FIG. 1B, the states of the flux bias control signals Flux_A, Flux_B, Flux_C, Flux_D, and Flux_E are represented by values "1" or "0" wherein a value of "1" indicates that the flux bias control signal is positively asserted (e.g., positive current pulse applied to the associated flux bias control line), and wherein a value of "0" indicates that the flux bias control signal is not asserted (e.g., no current pulse is applied to the associated flux bias control line).

For example, as shown in FIG. 1B, a first reciprocal signal routing path (denoted $P_1 \leftrightarrow P_2$) can be generated between the first and second ports $P_1$ and $P_2$ by applying flux bias control signals Flux_B and Flux_C to the flux bias control lines 122 and 123, while applying no flux bias control signals to the other flux bias control lines 121, 124, and 125. In this instance, the flux bias control signal Flux_B on the flux bias control line 122 causes the coupling inductor $L_{C9}$ to generate a magnetic flux, which threads through the superconducting loop of the fifth switch node 115, causing the fifth switch node 115 to be placed into a high impedance state (e.g., high inductance state). Similarly, the flux bias control signal Flux_C on the flux bias control line 123 causes the coupling inductors $L_{C5}$ and $L_{C7}$ to each generate a magnetic flux, which threads through the respective superconducting loops of the third and fourth switch nodes 113 and 114, causing each of the third and fourth switch nodes 113 and 114 to be placed into a high impedance state (e.g., high inductance state).

On the other hand, since no flux bias control signals are applied to the flux bias control lines 121, 124, and 125, there is no magnetic flux threading through the superconducting loops of the first and second switch nodes 111 and 112, resulting in the first and second switch nodes 111 and 112 being placed in a low impedance state (e.g., low inductance state). In this state of operation, a low impedance signal path is established between the first and second ports $P_1$ and $P_2$ through the serially coupled first and second switch nodes

111 and 112, which allows the transmission of an RF signal applied to the first port $P_1$ to flow through the switch circuit 110 and flow out from the second port $P_2$ (or vice versa), while the high impedance states of the third, fourth, and fifth switch nodes 113, 114, and 115 block the flow of RF signal energy to the third and fourth ports $P_3$ and $P_4$.

As further shown in FIG. 1B, a second reciprocal signal routing path (denoted $P_1 \leftrightarrow P_3$) can be generated between the first and third ports $P_1$ and $P_3$ by applying flux bias control signals Flux_A and Flux_D to the flux bias control lines 121 and 124, while applying no flux bias control signals to the other flux bias control lines 122, 123, and 125. In this instance, the flux bias control signal Flux_A on the flux bias control line 121 causes the coupling inductor $L_{C3}$ to generate a magnetic flux, which threads through the superconducting loop of the second switch node 112, causing the second switch node 112 to be placed into a high impedance state (e.g., high inductance state). Similarly, the flux bias control signal Flux_D on the flux bias control line 124 causes the coupling inductor $L_{C8}$ to generate a magnetic flux, which threads through the superconducting loops of the fourth switch node 114, causing the fourth switch node 114 to be placed into a high impedance state (e.g., high inductance state). On the other hand, since no flux bias control signals are applied to the flux bias control lines 122, 123, and 125, there is no magnetic flux threading through the superconducting loops of the third and fifth switch nodes 113 and 115, resulting in the third and fifth switch nodes 113 and 115 being placed in a low impedance state (e.g., low inductance state).

Moreover, even with the flux bias control signals Flux_A and Flux_D applied to the flux bias control lines 121 and 124, the first switch node 111 remains in a low impedance state because the magnetic fluxes, which are generated by the respective coupling inductors $L_{C1}$ and $L_{C2}$, are threaded through the superconducting loop of the first switch node 111 in opposing directions, effectively cancelling each other, and resulting in substantially a net zero (0) flux through the superconducting loop of the first switch node 111. In particular, based on the "right hand rule" of magnetism, assuming the direction of current flow on the flux bias control line 121 is from the flux signal generator 120-1 to the ground node GND, and assuming the direction of current flow on the flux bias control line 124 is from the flux signal generator 120-4 to the ground node GND, and assuming that the flux bias control signals Flux_A and Flux_D are the same or similar, the flux bias control signal Flux_A causes the coupling inductor $L_{C1}$ to generate a magnetic flux which flows through the superconducting loop of the first switch node 111 in a direction out of the plane of the drawing sheet, while the flux bias control signal Flux_D causes the coupling inductor $L_{C2}$ to generate a magnetic flux which flows through the superconducting loop of the first switch node 111 in a direction into the plane of the drawing sheet, thereby effectively canceling the magnetic fluxes flowing in the opposite directions.

In this state of operation, a low impedance signal path is established between the first and third ports $P_1$ and $P_3$ through the serially coupled first, second, and fifth switch nodes 111, 113, and 115. As such, an RF signal applied to the first port $P_1$ is transmitted through the switch circuit 110 and flows out from the third port $P_3$ (or vice versa), while the high impedance states of the second and fourth switch nodes 112 and 114 block the flow of RF signal energy to the second and fourth ports $P_2$ and $P_4$.

Moreover, as shown in FIG. 1B, a third reciprocal signal routing path (denoted $P_1 \leftrightarrow P_4$) can be generated between the first and fourth ports $P_1$ and $P_4$ by applying flux bias control signals Flux_B and Flux_E to the flux bias control lines 122 and 125, while applying no flux bias control signals to the other flux bias control lines 121, 123, and 124. In this instance, the flux bias control signal Flux_B on the flux bias control line 122 causes the coupling inductor $L_{C9}$ to generate a magnetic flux, which threads through the superconducting loop of the fifth switch node 115, causing the fifth switch node 115 to be placed into a high impedance state (e.g., high inductance state). Similarly, the flux bias control signal Flux_E on the flux bias control line 125 causes the coupling inductors $L_{C4}$ and $L_{C6}$ to each generate a magnetic flux, which threads through the respective superconducting loops of the second and third switch nodes 112 and 113, causing each of the second and third switch nodes 112 and 113 to be placed into a high impedance state (e.g., high inductance state).

On the other hand, since no flux bias control signals are applied to the flux bias control lines 121, 123, and 124, there is no magnetic flux threading through the superconducting loops of the first and fourth switch nodes 111 and 114, resulting in the first and fourth switch nodes 111 and 114 being placed in a low impedance state (e.g., low inductance state). In this state of operation, a low impedance signal path is established between the first and fourth ports $P_1$ and $P_4$ through the serially coupled first and fourth switch nodes 111 and 114. As such, an RF signal applied to the first port $P_1$ is transmitted through the switch circuit 110 and flows out from the fourth port $P_4$ (or vice versa), while the high impedance states of the second, third, and fifth switch nodes 112, 113, and 115 block the flow of RF signal energy to the second and third ports $P_2$ and $P_3$.

Next, as shown in FIG. 1B, a fourth reciprocal signal routing path (denoted $P_2 \leftrightarrow P_3$) can be generated between the second and third ports $P_2$ and $P_3$ by applying flux bias control signals Flux_B and Flux_D to the flux bias control lines 122 and 124, while applying no flux bias control signals to the other flux bias control lines 121, 123, and 125. In this instance, the flux bias control signal Flux_B on the flux bias control line 122 causes the coupling inductor $L_{C8}$ to generate a magnetic flux, which threads through the superconducting loop of the fifth switch node 115, causing the fifth switch node 115 to be placed into a high impedance state (e.g., high inductance state). Similarly, the flux bias control signal Flux_D on the flux bias control line 124 causes the coupling inductors $L_{C4}$ and $L_{C8}$ to each generate a magnetic flux, which threads through the respective superconducting loops of the first and fourth switch nodes 111 and 114, causing each of the first and fourth switch nodes 111 and 114 to be placed into a high impedance state (e.g., high inductance state).

On the other hand, since no flux bias control signals are applied to the flux bias control lines 121, 123, and 125, there is no magnetic flux threading through the superconducting loops of the second and third switch nodes 112 and 113, resulting in the second and third switch nodes 112 and 113 being placed in a low impedance state (e.g., low inductance state). In this state of operation, a low impedance signal path is established between the second and third ports $P_2$ and $P_3$ through the serially coupled second and third switch nodes 112 and 113. As such, an RF signal applied to the second port $P_2$ is transmitted through the switch circuit 110 and flows out from the third port $P_3$ (or vice versa), while the high impedance states of the first, fourth, and fifth switch nodes 111, 114, and 115 block the flow of RF signal energy to the first and fourth ports $P_1$ and $P_4$.

As further shown in FIG. 1B, a fifth reciprocal signal routing path (denoted $P_2 \leftrightarrow P_4$) can be generated between the second and fourth ports $P_2$ and $P_4$ by applying flux bias control signals Flux_A and Flux_E to the flux bias control lines 121 and 125, while applying no flux bias control signals to the other flux bias control lines 122, 123, and 124. In this instance, the flux bias control signal Flux_A on the flux bias control line 121 causes the coupling inductor $L_{C1}$ to generate a magnetic flux, which threads through the superconducting loop of the first switch node 111, causing the first switch node 111 to be placed into a high impedance state (e.g., high inductance state). Similarly, the flux bias control signal Flux_E on the flux bias control line 125 causes the coupling inductor $L_{C6}$ to generate a magnetic flux, which threads through the superconducting loops of the third switch node 113, causing the third switch node 113 to be placed into a high impedance state (e.g., high inductance state). On the other hand, since no flux bias control signals are applied to the flux bias control lines 122, 123, and 124, there is no magnetic flux threading through the superconducting loops of the fourth and fifth switch nodes 114 and 115, resulting in the fourth and fifth switch nodes 114 and 115 being placed in a low impedance state (e.g., low inductance state).

Moreover, even with the flux bias control signals Flux_A and Flux_E applied to the flux bias control lines 121 and 125, the second switch node 112 remains in a low impedance state because the magnetic fluxes, which are generated by the respective coupling inductors $L_{C3}$ and $L_{C4}$, are threaded through the superconducting loop of the second switch node 112 in opposing directions, effectively cancelling each other, and resulting in substantially a net zero (0) flux through the superconducting loop of the second switch node 112, for similar reasons as discussed above. In this state of operation, a low impedance signal path is established between the second and fourth ports $P_2$ and $P_4$ through the serially coupled second, fourth, and fifth switch nodes 112, 114, and 115. As such, an RF signal applied to the second port $P_2$ is transmitted through the switch circuit 110 and flows out from the fourth port $P_4$ (or vice versa), while the high impedance states of the first and third switch nodes 111 and 113 block the flow of RF signal energy to the first and third $P_1$ and $P_3$.

Finally, as shown in FIG. 1B, a sixth reciprocal signal routing path (denoted $P_3 \leftrightarrow P_4$) can be generated between the third and fourth ports $P_3$ and $P_4$ by applying flux bias control signals Flux_A and Flux_B to the flux bias control lines 121 and 122, while applying no flux bias control signals to the other flux bias control lines 123, 124, and 125. In this instance, the flux bias control signal Flux_A on the flux bias control line 121 causes the coupling inductors $L_{C1}$ and $L_{C3}$ to each generate a magnetic flux, which threads through the respective superconducting loops of the first and second switch nodes 111 and 112, causing each of the first and second switch nodes 111 and 112 to be placed into a high impedance state (e.g., high inductance state). Similarly, the flux bias control signal Flux_B on the flux bias control line 122 causes the coupling inductor $L_{C9}$ to generate a magnetic flux, which threads through the superconducting loop of the fifth switch node 115, causing the fifth switch node 115 to be placed into a high impedance state (e.g., high inductance state).

On the other hand, since no flux bias control signals are applied to the flux bias control lines 123, 124, and 125, there is no magnetic flux threading through the superconducting loops of the third and fourth switch nodes 113 and 114, resulting in the third and fourth switch nodes 113 and 114 being placed in a low impedance state (e.g., low inductance state). In this state of operation, a low impedance signal path is established between the third and fourth ports $P_3$ and $P_4$ through the serially coupled third and fourth switch nodes 113 and 114. As such, an RF signal applied to the third port $P_3$ is transmitted through the switch circuit 110 and flows out from the fourth port $P_4$ (or vice versa), while the high impedance states of the first, second, and fifth switch nodes 111, 112, and 115 block the flow of RF signal energy to the first and second $P_1$ and $P_2$.

It is to be noted that FIG. 1B illustrates non-limiting exemplary configurations for routing signals through the switch circuit 110, and that other configurations can be implemented. For example, a reciprocal signal routing path $(P_2 \leftrightarrow P_4)$ can be generated between the second and fourth ports $P_2$ and $P_4$ by applying flux bias control signals Flux_C and Flux_D to the flux bias control lines 123 and 124, while applying no flux bias control signals to the other flux bias control lines 121, 122, and 125. In this instance, a low impedance signal path is established between the second and fourth ports $P_2$ and $P_4$ through the serially coupled second, fourth, and fifth switch nodes 112, 114, and 115, with the first and third switch nodes 111 and 113 in a high impedance state.

In the context of a superconducting quantum computing system with quantum processors and quantum devices disposed in a base stage (e.g., millikelvin stage with temperatures less than 100 millikelvin) of a multi-stage dilution refrigerator, the exemplary signal switching circuitry 100 of FIG. 1A allows the switch circuit 110 to be disposed in the base stage of the dilution refrigerator, while routing a single RF control signal line (or high bandwidth control line) from, e.g., room temperature electronics, though the multi-stage dilution refrigerator to one port (e.g., port $P_1$) of the switch circuit 110, while the other ports (e.g., ports $P_2$, $P_3$, and $P_4$) can be coupled to respective quantum devices via respective RF transmission lines disposed in the base stage of the multi-stage dilution refrigerator. Advantageously, the switch circuit 110 enables a 4× reduction in the number of RF control lines that need to be routed through a multistage dilution refrigerator from, e.g., room temperature electronics to a base stage of the multi-stage dilution refrigerator.

In addition, a time-domain multiplexing scheme can be implemented to control the operation of the flux signal generators 120-1, 120-2, 120-3, 120-4, and 120-5 to selectively generate the flux bias control signals Flux_A, Flux_B, Flux_C, Flux_D, and/or Flux_E, as needed, to selectively route an RF control signal which is input to, e.g., the first port $P_1$ to any one of the other ports $P_2$, $P_3$, or $P_4$ of the switch circuit 110, at a given time, as discussed above in conjunction with FIG. 1B, for example. For example, in a non-limiting exemplary embodiment, the first port $P_1$ of the switch circuit 110 can be coupled to an RF control signal line, which receives qubit control pulses from a room temperature arbitrary wave generator (AWG) system, and the second, third, and fourth ports $P_2$, $P_3$, and $P_4$ can be coupled to respective superconducting qubits of a quantum processor, wherein a qubit control pulse applied to the first port $P_1$ is selectively routed to one of the ports $P_2$, $P_3$, or $P_4$ to apply the qubit control pulse to a target superconducting qubit.

Depending on the given application, the flux bias control signals Flux_A, Flux_B, Flux_C, Flux_D, and Flux_E can be static DC current signals, or baseband current pulses (with DC and frequency components up to, e.g., 1 GHz). In some embodiments, the flux signal generators 120-1, 120-2, 120-3, 120-4, and 120-5 comprise current-mode digital-toanalog converter (DAC) circuits that are configured to generate any suitable type of flux bias pulses with a desired basis function (control pulse envelopes) such as Gaussian pulses, Gaussian square pulses, etc.

Figure 2A:
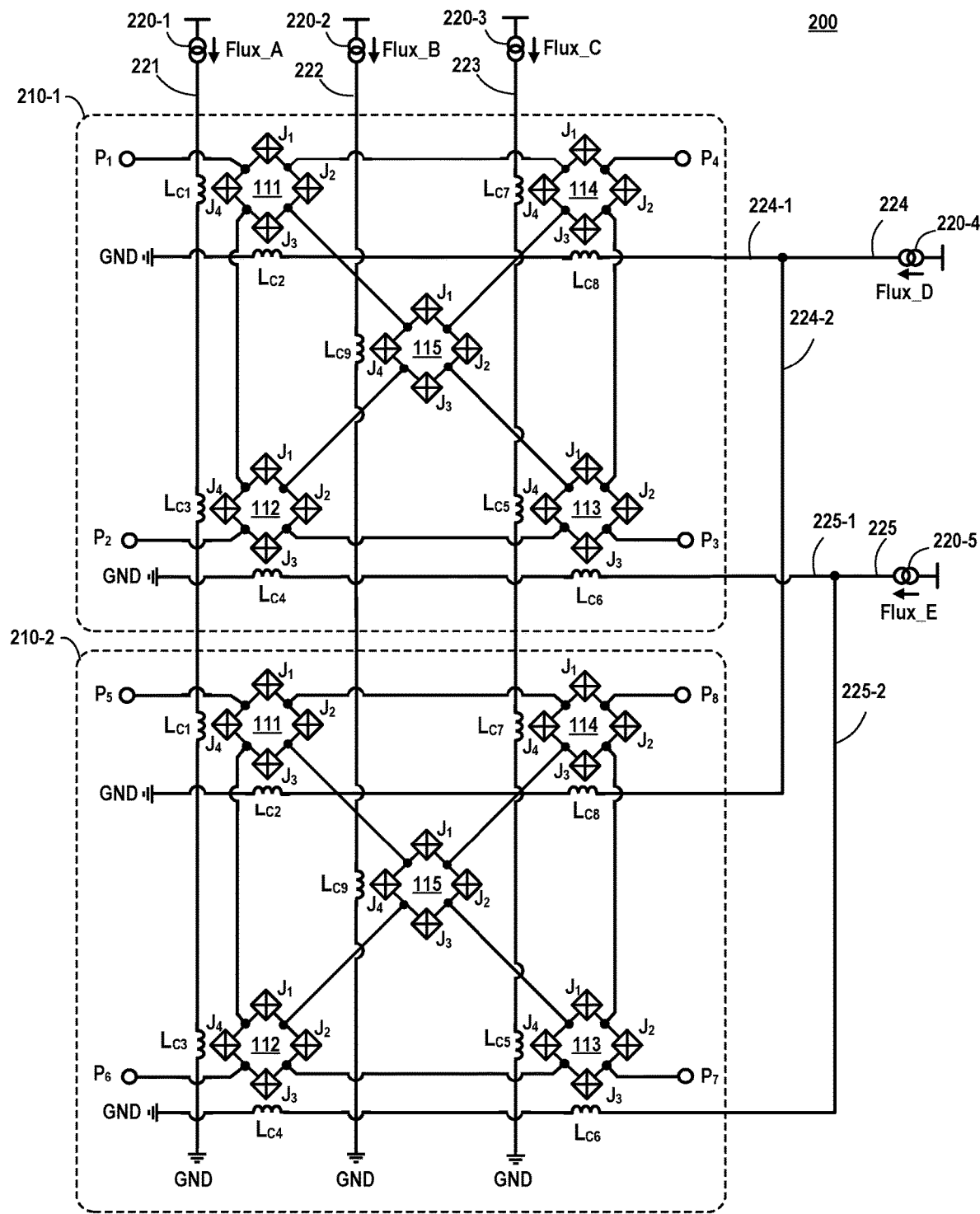
FIG. 2A schematically illustrates signal switching circuitry, according to another exemplary embodiment of the disclosure.

While FIG. 1A illustrates an exemplary configuration of signal switching circuitry 100 with one superconducting multi-way reciprocal all-to-all switch circuit 110, it is to be appreciated that in other embodiments, signal switching circuitry can be implemented using multiple instances of the superconducting multi-way reciprocal all-to-all switch circuit 110, wherein the multiple instances of the switch circuit 110 are commonly controlled using the same flux bias control signals to limit the overhead associated with flux bias controlling the multiple instances of the switch circuit 110. For example, FIG. 2A schematically illustrates signal switching circuitry, according to an exemplary embodiment of the disclosure. In particular, FIG. 2A schematically illustrates signal switching circuitry 200 which is similar to the signal switching circuitry 100 of FIG. 1A, except that the signal switching circuitry 200 includes at least a first superconducting multi-way reciprocal switch circuit 210-1 (referred to as first switch circuit 210-1) and a second superconducting multi-way reciprocal all-to-all switch circuit 210-2 (referred to as second switch circuit 210-2), wherein the first and second switch circuits 210-1 and 210-2 are commonly coupled to flux bias control lines 221, 222, 223, 224, and 225, and commonly controlled by flux bias control signals Flux_A, Flux_B, Flux_C, Flux_D, and Flux_E which are generated by respective flux signal generators 220-1, 220-2, 220-3, 220-4, and 220-5.

In an exemplary embodiment, the first and second switch circuits 210-1 and 210-2 have the same or similar circuit architecture as the switch circuit 110 of FIG. 1A, and operate in the same or similar manner as the switch circuit 110, as discussed above, the details of which will not be repeated. The first and second switch circuits 210-1 and 210-2 operate independent from each other in that the first switch circuit 210-1 is operatively controlled to route RF signals between four ports, $P_1$, $P_2$, $P_3$, and $P_4$ of the first switch circuit 210-1, while the second switch circuit 210-2 is operatively controlled to route RF signals between four ports, $P_5$, $P_6$, $P_7$, and $P_8$ of the second switch circuit 210-2. The first and second switch circuits 210-1 and 210-2 operate independently from each other, but are commonly controlled by flux bias control signals Flux_A, Flux_B, Flux_C, Flux_D, and Flux_E applied to respective flux bias control lines 221, 222, 223, 224, and 225.

In particular, as schematically illustrated in FIG. 2A, the flux bias control line 221 is coupled to and between the flux signal generator 220-1 and the ground node GND, and comprises the coupling inductors $L_{C1}$ and $L_{C3}$ which are configured to apply magnetic flux to the first and second switch nodes 111 and 112 of the first and second switch circuits 210-1 and 210-2, when the flux bias control signal Flux_A is applied to the flux bias control line 221. The flux bias control line 222 is coupled to and between the flux signal generator 220-2 and the ground node GND, and comprises the coupling inductors $L_{C9}$ which are configured to apply magnetic flux to the fifth switch nodes 115 of the first and second switch circuits 210-1 and 210-2, when the flux bias control signal Flux_B is applied to the flux bias control line 222. The flux bias control line 223 is coupled to and between the flux signal generator 220-3 and the ground node GND, and comprises the coupling inductors $L_{C5}$ and $L_{C7}$ which are configured to apply magnetic flux to the third and fourth switch nodes 113 and 114 of the first and second switch circuits 210-1 and 210-2, when the flux bias control signal Flux_C is applied to the flux bias control line 223.

Furthermore, as schematically shown in FIG. 2A, the flux bias control line 224 is coupled to the flux signal generator 220-4, and feeds the flux bias control signal Flux_D to a first control line branch 224-1, and a second control line branch 224-2. The first control line branch 224-1 comprises the coupling inductors $L_{C2}$ and $L_{C8}$ that are configured to apply magnetic flux to the first and fourth switch nodes 111 and 114 of the first switch circuit 210-1, and the second control line branch 224-2 comprises the coupling inductors $L_{C2}$ and $L_{C8}$ that are configured to apply magnetic flux to the first and fourth switch nodes 111 and 114 of the second switch circuit 210-2. Similarly, the flux bias control line 225 is coupled to the flux signal generator 220-5, and feeds the flux bias control signal Flux_E to a first control line branch 225-1, and a second control line branch 225-2. The first control line branch 225-1 comprises the coupling inductors $L_{C4}$ and $L_{C6}$ that are configured to apply magnetic flux to the second and third switch nodes 112 and 113 of the first switch circuit 210-1, and the second control line branch 225-2 comprises the coupling inductors $L_{C4}$ and $L_{C6}$ that are configured to apply magnetic flux to the second and third switch nodes 112 and 113 of the second switch circuit 210-2.

While the exemplary architecture of the signal switching circuitry 200 of FIG. 2A shows first and second switch circuits 210-1 and 210-2 for ease of illustration and explanation, it is to be understood that the signal switching circuitry 200 can be implemented with any number n of switch circuits, e.g., 210-1, 210-2, . . . , 210-n, wherein n can be on order of tens or hundreds of parallel 4-port switch circuits. In such embodiments, since the flux bias control lines are superconducting lines disposed in the dilution refrigerator, there is no power dissipation resulting from the flux bias control signals propagating along the flux bias control lines. For example, the flux bias control lines 221, 223 and 223 can be made relatively long to feed, e.g., 100 switch circuits without resulting in degradation of the flux bias control signals Flux_A, Flux_B and Flux_C due to power dissipation as the flux bias control signals Flux_A, Flux_B and Flux_C are applied to all the switch circuit.

With regard to the branching flux bias control lines 224 and 225, the magnitude of the flux bias control signals Flux_D and Flux_E are increased to account for the power division that occurs when the flux bias control lines 224 and 225 branch into two or more separate branches to feed the flux bias control signals Flux_D and Flux_E to the plurality of switch circuits. For example, in the exemplary configuration of FIG. 2A, the current magnitude of the flux bias control signals Flux_D and Flux_E is doubled to accommodate for the splitting of the signals into two separate branches to feed the first and second switch circuits 210-1 and 210-2.

Figure 2B:
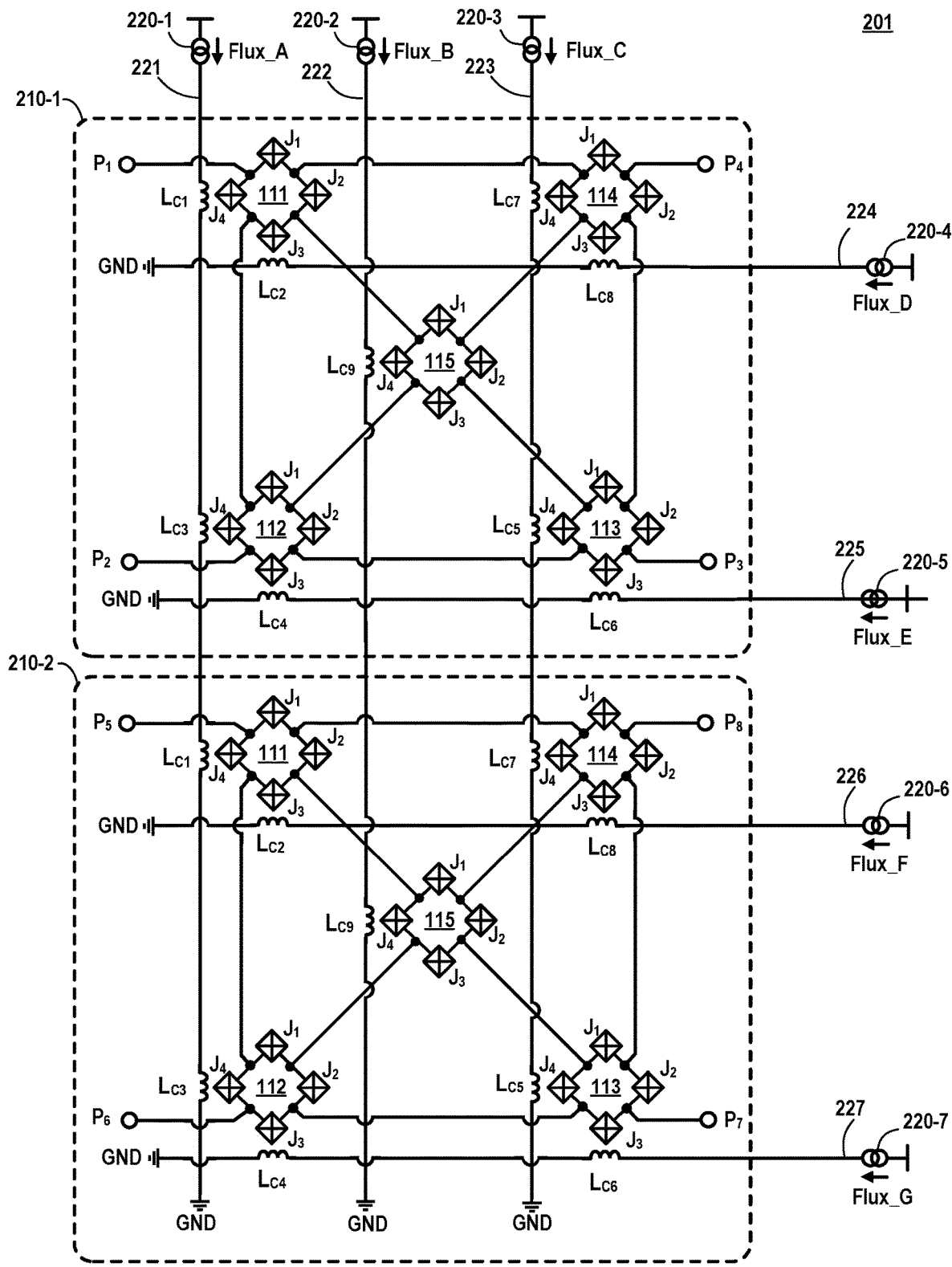
FIG. 2B schematically illustrates signal switching circuitry, according to another exemplary embodiment of the disclosure.

FIG. 2A illustrates an exemplary architecture in which the number of flux bias control lines, e.g., 5 flux bias control lines 221, 222, 223, 224, and 225, which are utilized to commonly control a plurality of switch circuits remains constant for any suitable number n of switch circuits. Other flux bias control line architectures, however, can be implemented, depending on the given application. For example, FIG. 2B schematically illustrates signal switching circuitry 201, according to another exemplary embodiment of the disclosure. The signal switching circuitry 201 of FIG. 2B is similar to the signal switching circuitry 200 of FIG. 2A, except that the flux bias control lines 224 and 225 are utilized to apply the flux bias control signals Flux_D and Flux_E to only the first switch circuit 210-1, and there is no branching of the flux bias control lines 224 and 225 to apply the flux bias control signals Flux_D and Flux_E to the second switch circuit 210-2.

Instead, the signal switching circuitry 201 in FIG. 2B utilizes two additional flux bias signal generators 220-6 and 220-7 to generate flux bias control signals Flux_F and Flux_G, and two additional flux bias control lines 226 and 227 to apply the flux bias control signals Flux_F and Flux_G to the second switch circuit 210-2. In particular, as shown in FIG. 2B, the flux bias control line 226 is coupled to and between the flux signal generator 220-6 and the ground node GND, and feeds the flux bias control signal Flux_F to the coupling inductors $L_{C2}$ and $L_{C8}$, which are configured to apply magnetic flux to the first and fourth switch nodes 111 and 114, respectively, of the second switch circuit 210-2. Similarly, the flux bias control line 227 is coupled to and between the flux signal generator 220-7 and the ground node GND, and feeds the flux bias control signal Flux_F to the coupling inductors $L_{C4}$ and $L_{C6}$, which are configured to apply magnetic flux to the second and third switch nodes 112 and 113, respectively, of the second switch circuit 210-2.

The signal switching circuitry 201 in FIG. 2B illustrates an exemplary architecture in which only two additional (horizontal) flux bias control lines are added for each additional switch circuit. For instance, the signal switching circuitry with a single switch circuit (FIG. 1A) would utilize an all-to-all configuration of 5 flux bias control lines (3 vertical and 2 horizontal). The signal switching circuitry 210 in FIG. 2B with two switch circuits 210-1 and 210-2 utilizes an all-to-all configuration of 7 flux bias control lines (3 vertical and 4 horizontal). Further, signal switching circuitry with 3 switch circuits would utilize an all-to-all configuration of 9 flux bias control lines (3 vertical and 6 horizontal), etc.

In other embodiments, the signal switching circuitry of, e.g., FIGS. 1A, 2A, and 2B, can be integrated with impedance matching networks to provide broadband impedance matching for the switch node matrix either between "nominally identical impedances" or mismatched/dissimilar impedances at I/O ports of the switch circuits. The term "nominally identical impedances" between two I/O ports means that the two I/O ports have the same stated "characteristic impedance" value (e.g., 50 Ohms) while the actual impedance values can slightly vary from the stated characteristic impedance value and still be considered to have nominally identical impedances. For example, for a nominal 50 Ohm characteristic impedance, the actual impedance values can slightly vary from 50 Ohms by some acceptable amount (e.g. actual impedance in a range of 48 Ohms to 53.5 Ohms) and still be considered as a 50 Ohm characteristic impedance.

Figure 3:
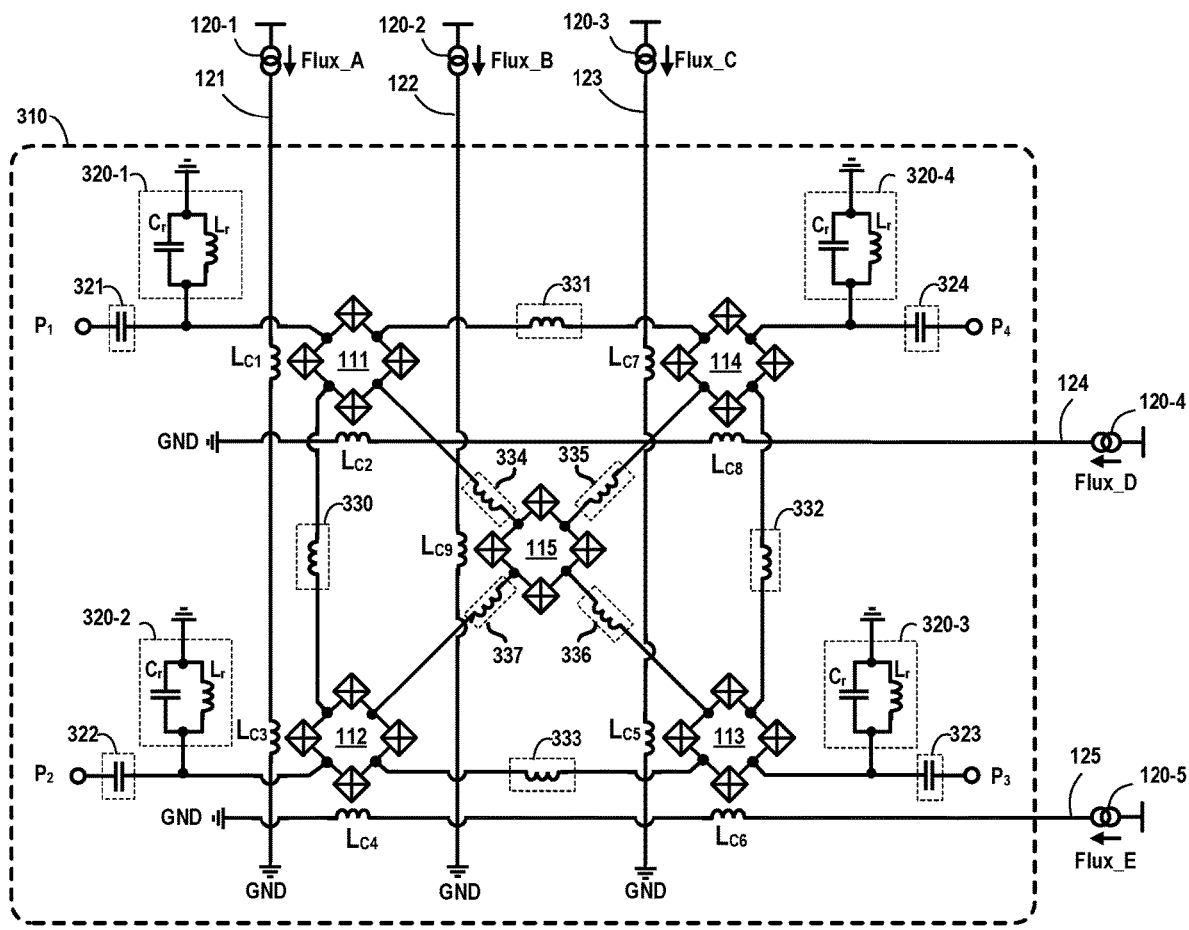
FIG. 3 schematically illustrates signal switching circuitry which comprises an integrated impedance matching network, according to an exemplary embodiment of the disclosure.

FIG. 3 schematically illustrates signal switching circuitry which is integrated with an impedance matching network, according to an exemplary embodiment of the disclosure. In particular, FIG. 3 schematically illustrates signal switching circuitry 300 which comprises a superconducting multi-way reciprocal all-to-all switch circuit 310 (or simply, switch circuit 310) which comprises an integrated impedance matching network to enable impedance matching and a larger bandwidth of signals to be routed between the I/O ports $P_1$, $P_2$, $P_3$, and $P_4$ of the switch circuit 310. The signal switching circuitry 300 of FIG. 3 is similar to the signal switching circuitry 100 of FIG. 1A in that the signal switching circuitry 300 comprises the flux bias signal generators 120-1, 120-2, 120-3, 120-4, and 120-5, and associated flux bias control lines 121, 122, 123, 124, and 125. Further, the switch circuit 310 of FIG. 3 is similar to the switch circuit 110 of FIG. 1A in that the switch circuit 310 comprises the switch nodes 111, 112, 113, 114, and 115, arranged in an all-to-all configuration to provide a reciprocal 4-way signal routing architecture in which RF signals can be routed between any pair of the I/O ports $P_1$, $P_2$, $P_3$, and $P_4$.

The switch circuit 310 further includes an integrated impedance matching network comprising a plurality of shunt resonators 320-1, 320-2, 320-3, and 320-4, and a plurality of immittance inverters 321, 322, 323, 324, which are coupled to the I/O ports $P_1$, $P_2$, $P_3$, and $P_4$, and a plurality of immittance inverters 330, 331, 332, 333, 334, 335, 336, and 337 disposed in signal paths between the switch nodes 111, 112, 113, 114, and 115. In some embodiments, the shunt resonators 320-1, 320-2, 320-3, and 320-4 comprise LC resonators, wherein each shunt resonator 320-1, 320-2, 320-3, and 320-4 comprises a capacitor $C_r$ and inductor $L_r$ coupled in parallel and shunted to the ground node GND.

In some embodiments, the immittance inverters 321-324 and 330-337 comprise admittance inverters. In other embodiments, the immittance inverters 321-324 and 330-337 comprise impedance inverters. In this regard, the terms "immittance inverting" or "immittance inverter" as used herein broadly denotes terms such as admittance inverting, admittance inverter, impedance inverting, or impedance inverter. In the non-limiting exemplary embodiment of FIG. 3, the immittance inverters 321-324 and 330-337 comprise admittance inverters, wherein the immittance inverters 321-324 comprise admittance inverters that are implemented using capacitors, and the immittance inverters 330-337 comprise admittance inverters that are implemented using inductors. The admittance inverters may be implemented using capacitive 7E-networks, inductive π-networks, and/or quarter-wavelength transmission lines.

In the exemplary embodiment of FIG. 3, the plurality of shunt resonators 320-1, 320-2, 320-3, and 320-4, and the plurality of immittance inverters 321-324 and 330-337 of the integrated impedance matching network essentially implement a plurality of multipole bandpass filters between each pair of I/O ports $P_1$, $P_2$, $P_3$, and $P_4$. In particular, the shunt resonators 320-1 and 320-2 and the immittance inverters 321, 322, and 330 collectively comprise an immittance inverting two-pole bandpass filter network in the signal path between the first port $P_1$ and the second port $P_2$. The shunt resonators 320-1 and 320-3 and the immittance inverters 321, 323, 334, and 335, collectively comprise an immittance inverting two-pole bandpass filter network in the signal path between the first port $P_1$ and the third port $P_3$. The shunt resonators 320-1 and 320-4 and the immittance inverters 321, 324, and 331 collectively comprise an immittance inverting two-pole bandpass filter network in the signal path between the first port $P_1$ and the fourth port $P_4$. The shunt resonators 320-2 and 320-3 and the immittance inverters 322, 323, and 333 collectively comprise an immittance inverting two-pole bandpass filter network in the signal path between the second port $P_2$ and the third port $P_3$. The shunt resonators 320-2 and 320-4 and the immittance inverters 322, 324, 335, and 335, collectively comprise an immittance inverting two-pole bandpass filter network in the signal path between the second port $P_2$ and the fourth port $P_4$. The shunt resonators 320-3 and 320-4 and the immittance inverters 323, 324, and 332 collectively comprise an immittance inverting two-pole bandpass filter network in the signal path between the third port $P_3$ and the fourth port $P_4$.

In the exemplary architecture of FIG. 3, each immittance inverting multipole bandpass filter between each pair of I/O ports comprises p poles (e.g., p=2) provided by p shunt resonators (e.g., 2 shunt resonators providing 2 filter poles), wherein each shunt resonator is disposed between two immittance inverters such that a number m of immittance inverters is m=p+1. The shunt resonators 320-1, 320-2, 320-3, and 320-4 are configured to have respective resonant (angular) frequencies $\omega_1$, $\omega_2$, $\omega_3$, and $\omega_4$, as desired for the given operating bandwidth. The immittance inverters essentially function as impedance matching circuits to, e.g., match impedance between adjacent shunt resonators and match impedances between the ports. In this regard, the immittance inverting multipole bandpass filters between the I/O ports serves to increase the signal bandwidth of the signal paths between the I/O ports, as well as counter impedance mismatches at the I/O ports as a result of the inductances of the Josephson junctions of the switch nodes between the I/O ports. For example, the immittance inverting multipole bandpass filter (formed by shunt resonators 320-1 and 320-2 and immittance inverters 321, 322, and 330) between the first and second ports $P_1$ and $P_2$ is configured to compensate for the impedance mismatch between the first and second ports $P_1$ and $P_2$ due to the inductances of the Josephson junction of the first and second switch nodes 111 and 112 in the signal path between the between the first and second ports $P_1$ and $P_2$.

In some embodiments, the immittance inverting multipole bandpass filters between the I/O ports can be designed to match the impedances between a pair of I/O ports so that the I/O impedances are matched (e.g., 50 Ohms). In other embodiments, the I/O impedances between a pair of I/O ports can be dissimilar, wherein the immittance inverting multipole bandpass filter between the pair of I/O ports can be designed to match the dissimilar impedances. For example, assume that the input impedance at the first port $P_1$ is 50 Ohms and that the output impedance at the second port $P_2$ is 30 Ohms. The immittance inverting multipole bandpass filter (formed by shunt resonators 320-1 and 320-2 and immittance inverters 321, 322, and 330) between the first and second ports $P_1$ and $P_2$ can be configured to match the 50 Ohm input impedance at the first port $P_1$ with the 30 Ohms output impedance at the second port $P_2$.

Figure 4:
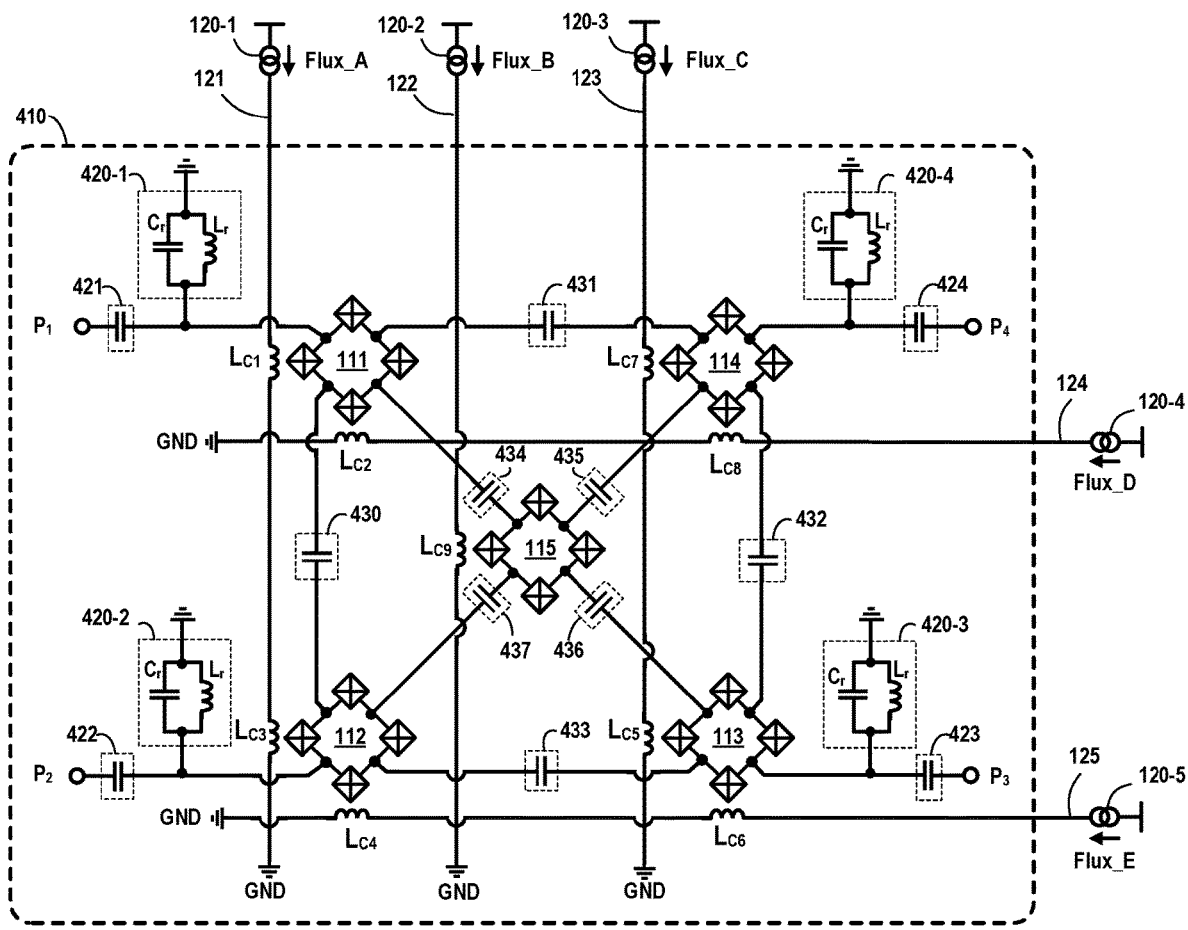
FIG. 4 schematically illustrates signal switching circuitry which comprises an integrated impedance matching network, according to another exemplary embodiment of the disclosure.
Figure 5:
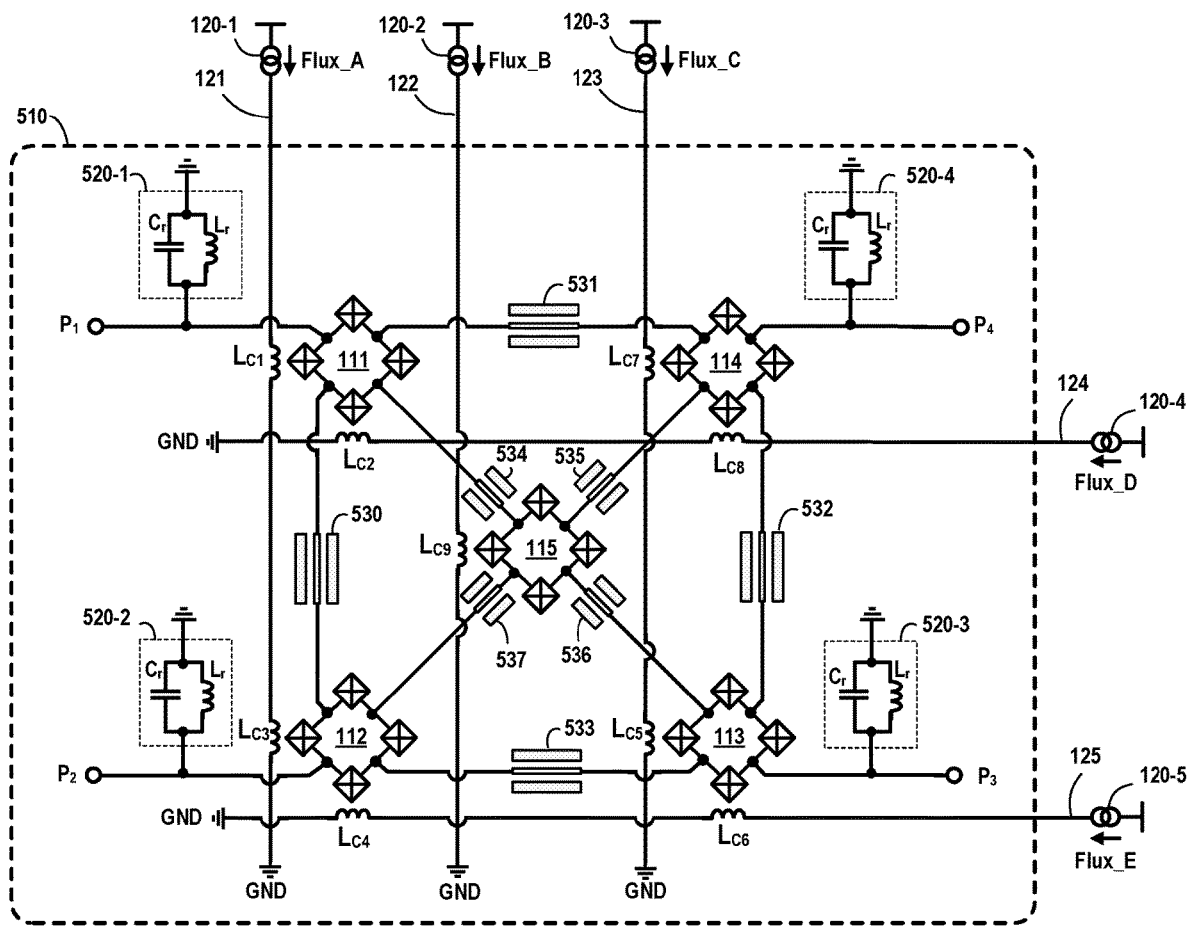
FIG. 5 schematically illustrates signal switching circuitry which comprises an integrated impedance matching network, according to another exemplary embodiment of the disclosure.

As noted above, while FIG. 3 illustrates an exemplary embodiment in which the immittance inverters comprise admittance inverters that are implemented using capacitors and inductors, in other embodiments, the admittance inverters can be implemented using capacitive 7E-networks (e.g., FIG. 4) or quarter-wavelength transmission lines (e.g., FIG. 5). For example, FIG. 4 schematically illustrates signal switching circuitry which is integrated with an impedance matching network, according to another exemplary embodiment of the disclosure. In particular, FIG. 4 illustrates signal switching circuitry 400 which is similar to the signal switching circuitry 300 of FIG. 3, except that the signal switching circuitry 400 comprises a switch circuit 410 having an integrated impedance matching network with immittance inverters that are implemented using capacitors.

More specifically, as shown in FIG. 4, the switch circuit 410 comprises an integrated impedance matching network which comprise a plurality of shunt resonators 420-1, 420-2, 420-3, and 420-4, and a plurality of immittance inverters 421, 422, 423, 424 which are coupled to the I/O ports $P_1$, $P_2$, $P_3$, and $P_4$, and a plurality of immittance inverters 430, 431, 432, 433, 434, 435, 436, and 437 disposed in signal paths between the switch nodes 111, 112, 113, 114, and 115, wherein the immittance inverters 421-424 and 430-437 comprises admittance inverters that are implemented using capacitors. The integrated impedance matching network in FIG. 4 operates in the same and similar manner as the integrated impedance matching network of FIG. 3, the details of which need not be repeated.

Next, FIG. 5 schematically illustrates signal switching circuitry which is integrated with an impedance matching network, according to another exemplary embodiment of the disclosure. In particular, FIG. 5 illustrates signal switching circuitry 500 which is similar to the exemplary embodiment of signal switching circuitry shown in FIGS. 3 and 4, except that the signal switching circuitry 500 comprises a switch circuit 510 having an integrated impedance matching network with immittance inverters that are implemented using 90-degree transmission lines, instead of capacitor or inductors. More specifically, as shown in FIG. 5, the switch circuit 510 comprises an integrated impedance matching network which comprises a plurality of shunt resonators 520-1, 520-2, 520-3, and 520-4 which are coupled to the I/O ports $P_1$, $P_2$, $P_3$, and $P_4$, and a plurality of immittance inverters 530, 531, 532, 533, 534, 535, 536, and 537 which are disposed in signal paths between the switch nodes 111, 112, 113, 114, and 115.

In some embodiments, the immittance inverters 530, 531, 532, and 533 comprise admittance inverters that are implemented using quarter-wavelength (90 degree) transmission lines, and the immittance inverters 534, 535, 536, and 537 comprise admittance inverters that are implemented using one-eighth-wavelength (45 degree) transmission lines. The two immittance inverters 534 and 536 (e.g., two 45-degree transmission lines) collectively provide a quarter-wavelength (90 degree) transmission line in the signal path between the first and third switch nodes 111 and 113 (through the fifth switch node 115), and the two immittance inverters 535 and 537 (e.g., two 45-degree transmission lines) collectively provide a quarter-wavelength (90 degree) transmission line in the signal path between the second and fourth switch nodes 112 and 114 (through the fifth switch node 115). The integrated impedance matching network in FIG. 5 operates in the same and similar manner as the integrated impedance matching network of FIG. 3, the details of which need not be repeated.

Figure 6A:
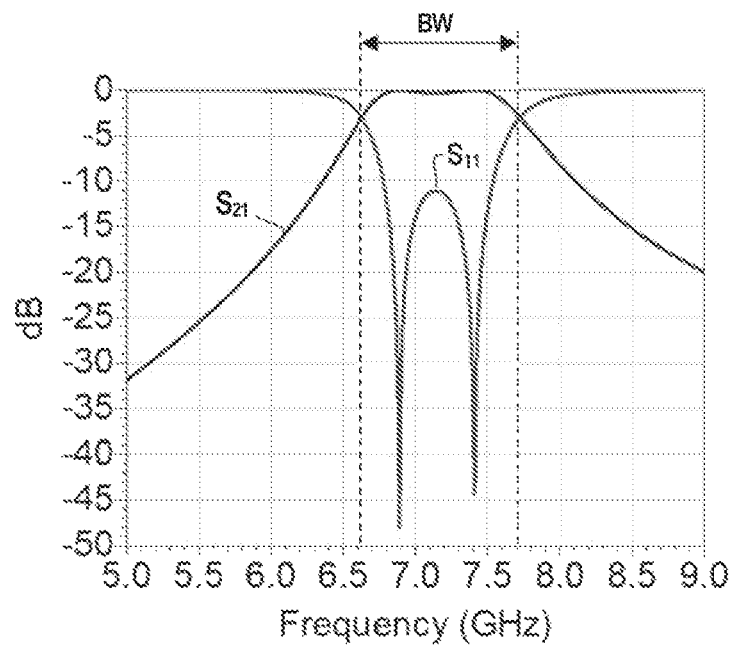
FIGS. 6A, 6B, and 6C depict simulated scattering parameter waveforms which show operating modes of a switch circuit, according to exemplary embodiments of the disclosure.
Figure 6B:
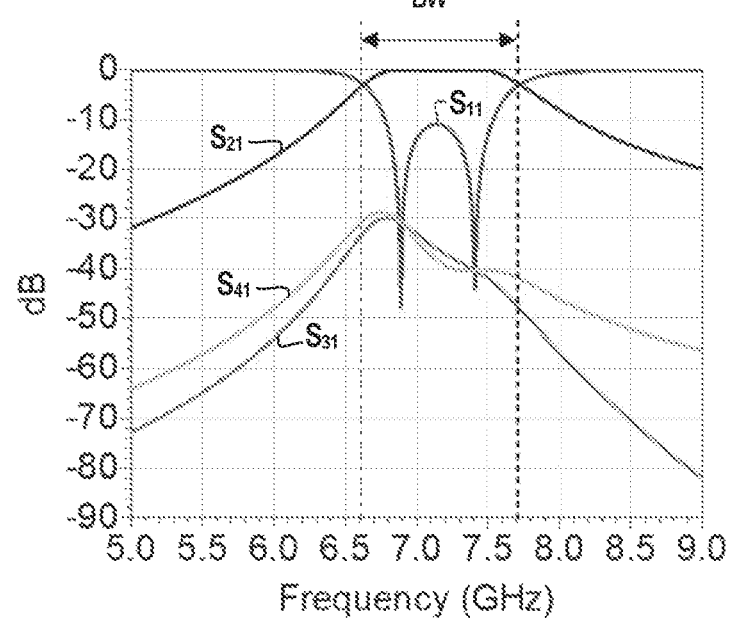
Figure 6C:
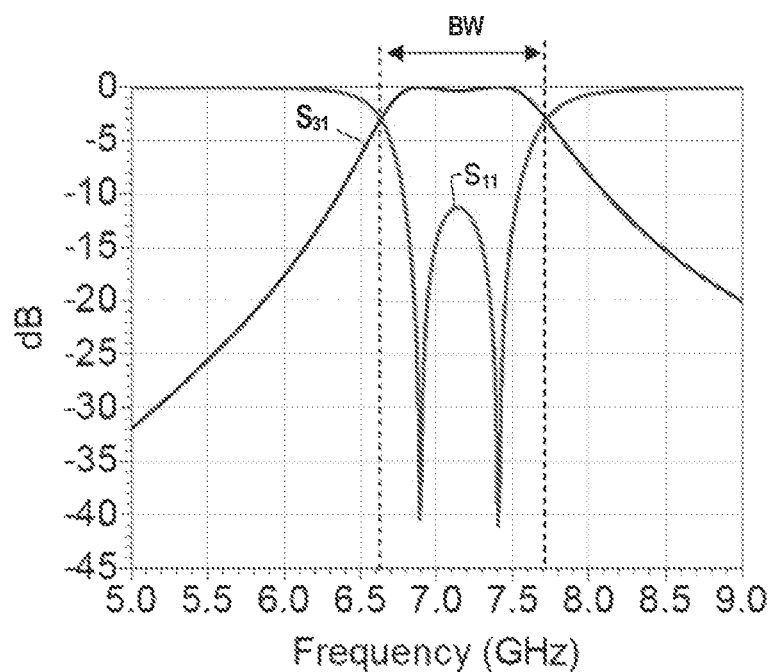

FIGS. 6A, 6B, and 6C depict simulated scattering parameter waveforms which show operating modes of a multi-way reciprocal switch circuit, according to exemplary embodiments of the disclosure. More specifically, FIGS. 6A, 6B, and 6C depict simulated scattering parameter waveforms which show exemplary modes of operation of a multi-way reciprocal switch circuit 310 which comprises an integrated impedance matching network, such as shown in FIG. 3. FIG. 6A illustrates simulated waveforms 600 of scattering parameters $Si_1$ and $S_{21}$ in terms of power in dB (y-axis) as a function of frequency in GHz (x-axis) in an operating state of the switch circuit 310 (FIG. 3), wherein the flux bias signals Flux_B and Flux_C are applied on the flux bias control lines 122 and 123 to place the third, fourth, and fifth switch nodes 113, 114, and 115 in a high impedance state, and wherein the first and second switch nodes 111 and 112 are in a low impedance state to selectively configure a signal routing path between the first and second ports $P_1$ and $P_2$. FIG. 6B illustrates simulated waveforms 610 of the scattering parameters $S_{11}$ and $S_{21}$ as well as the $S_{31}$ and $S_{41}$ under the same operating state of the switch circuit 310 with a signal routing path configured between the first and second ports $P_1$ and $P_2$.

FIG. 6A illustrates that the power transmission ($S_{21}$) from the first port $P_1$ to the second port $P_2$ is near unity over a given bandwidth BW (as represented by 3 dB points) with a low reflection loss ($S_{11}$) at the first port $P_1$. In particular, FIG. 6A illustrates near unity power transmission ($S_{21}$) over a relatively wide frequency band of about 1 GHz (e.g., from about 6.6 GHz to about 7.6 GHz), with a reflection loss $S_{11}$ of about −12 dB or less. Further, FIG. 6B illustrates that both the power transmission ($S_{31}$) from the first port $P_1$ to the third port $P_3$, and the power transmission ($S_{41}$) from the first port $P_1$ to the fourth port $P_4$, is significant suppressed, e.g., approximately −30 dB or more over the given bandwidth BW. In other words, FIG. 6B illustrates that the multi-way reciprocal switch circuit 310 provides relatively large crosstalk suppression (or small leakage) between the selected signal routing path through the switch circuit 310 from the first port $P_1$ to the second port $P_2$, and the non-selected signal routing paths through the switch circuit 310 (i.e., the non-selected signal paths from the first port $P_1$ to the third port $P_3$, and from the first port $P_1$ to the fourth port $P_4$). FIG. 6B illustrates that a relatively high suppression of crosstalk is achieved by the switch circuit 310 despite the compact size of the switch circuit 310, wherein the leakage through any of the switch nodes 113, 114, and 115 in the high impedance states is reduced by three orders of magnitude as compared to desired signal transmission through the switch nodes 111 and 112 in the low impedance states, between the desired I/O ports $P_1$ and $P_2$.

FIG. 6C illustrates simulated waveforms 620 of scattering parameters $S_{31}$ and $S_{11}$ in terms of power in dB (y-axis) as a function of frequency in GHz (x-axis) in an operating state of the switch circuit 310 (of FIG. 3), wherein the flux bias signals Flux_A and Flux_D are applied on the flux bias control lines 121 and 124 to place the second and fourth switch nodes 112 and 114 in a high impedance state, and wherein the first, third, and fifth switch nodes 111, 113, and 115 are in a low impedance state to selectively configure a signal routing path between the first and third ports $P_1$ and $P_3$. FIG. 6C illustrates that the power transmission ($S_{31}$) from the first port $P_1$ to the third port $P_3$ is near unity over the given bandwidth BW (as represented by 3 dB points) with a low reflection loss ($S_{11}$) at the first port $P_1$. In particular, FIG. 6C illustrates near unity power transmission ($S_{31}$) over a relatively wide frequency band of about 1 GHz (e.g., from about 6.6 GHz to about 7.6 GHz), with a reflection loss $S_{11}$ of about −12 dB or less. FIGS. 6A and 6C illustrate that similar scattering characteristics are achieved with different signal routing paths through the all-to-all switch circuit 310 between different pairwise combinations of the ports $P_1$, $P_2$, $P_3$, and $P_4$.

Figure 7:
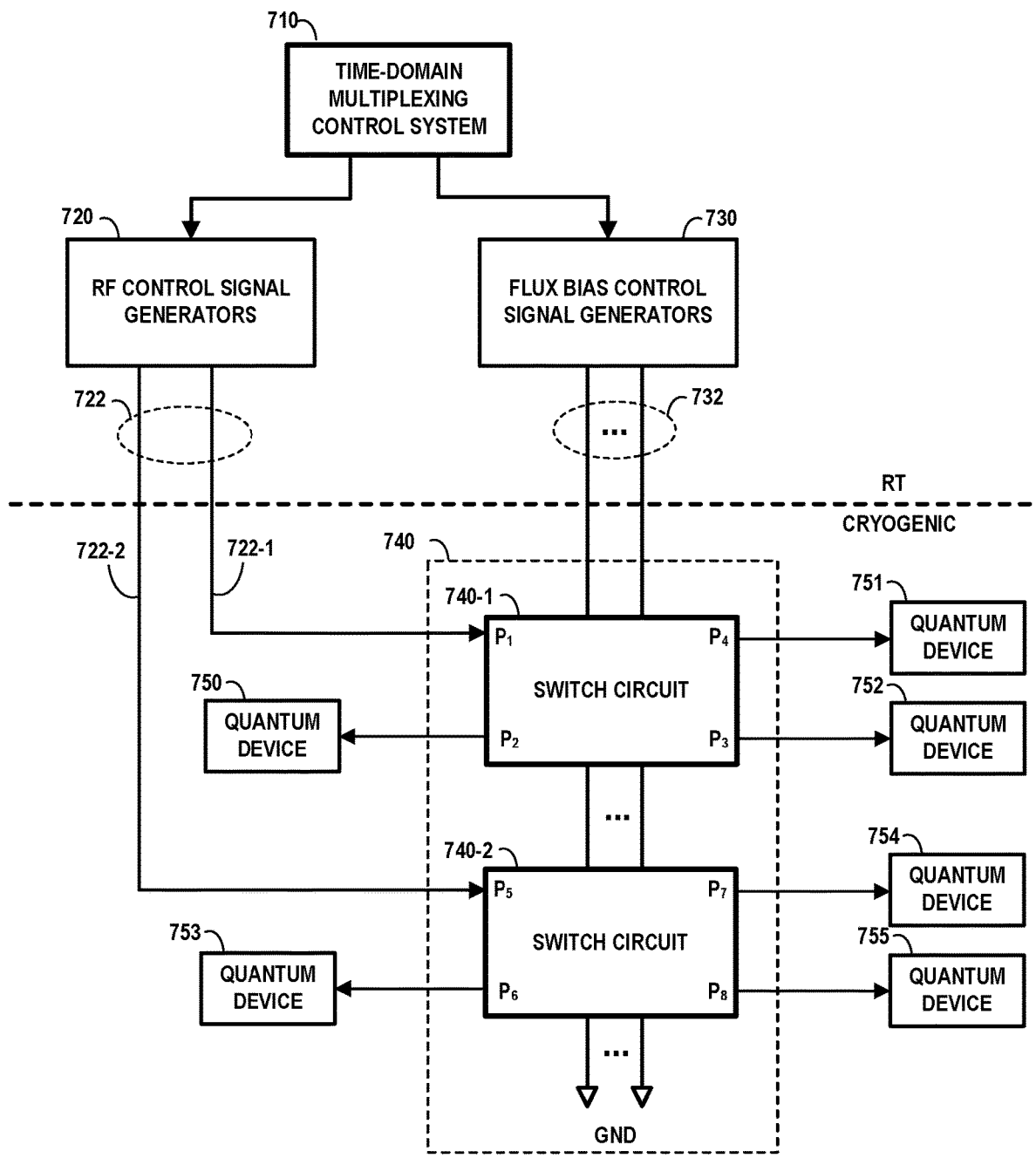
FIG. 7 schematically illustrates a quantum computing system which comprises signal switching circuitry, according to an exemplary embodiment of the disclosure.

It is to be appreciated that the implementation of signal switching circuitry which comprises a plurality of superconducting multiway switch circuits, as discussed herein, allows multiple quantum devices (e.g., qubits, amplifiers) to be concurrently controlled, operated, tested, etc., using a time-domain multiplexing control process. For example, FIG. 7 schematically illustrates a quantum computing system 700 which comprises signal switching circuitry, according to an exemplary embodiment of the disclosure. The quantum computing system 700 comprises a time-domain multiplexing control system 710, RF control signal generators 720, flux bias control signal generators 730, signal switching circuitry 740 comprising a first 4-way switch circuit 740-1 and a second 4-way switch circuit 740-2, and a plurality of quantum devices 750, 751, 752, 753, 754, and 755. In an exemplar embodiment, the time-domain multiplexing control system 710, the RF control signal generators 720, and the flux bias control signal generators 730 comprise electronic components and systems that are disposed and are operated in a room temperature (RT) environment, while signal switching circuitry 740 and the quantum devices 750-755 are disposed and operate in a cryogenic temperature environment, e.g., a mK stage of a dilution refrigerator.

The quantum devices 750, 751, 752, 753, 754, and 755 represent any type of quantum devices which are controlled by RF signals (e.g., RF control pulses) that are generated by the RF control signal generators 720. For example, the quantum devices 750, 751, 752, 753, 754, and 755 can include superconducting qubits having quantum states that that are controlled by applying RF control pulses to qubit drive lines of the superconducting qubits to change the quantum state of the superconducting qubits (e.g., change the quantum state of a given qubit between the ground state and excited state, or to a superposition state) when executing quantum information processing algorithms. The quantum devices 750, 751, 752, 753, 754, and 755 can include superconducting qubit couplers that are responsive to RF control pulses to control exchange interactions between adjacent superconducting qubits to facilitate entanglement operations. The quantum devices 750, 751, 752, 753, 754, and 755 can be superconducting amplifier devices (e.g., traveling-wave parametric amplifiers) which utilize input RF pump signals for amplifying qubit readout signals.

The RF control signal generators 720 include, for example, arbitrary waveform generators (AWGs) that are configured to generate different RF control pulses with center frequencies, pulse shapes (e.g., gaussian pulse envelope, Raman pulse envelope, etc.), and durations, as needed, to control target quantum devices (e.g., qubits). In addition, the RF control signal generators 720 are configured to generate pure tone RF signals to provide pump control signals that are applied to the quantum devices (e.g., traveling-wave parametric amplifiers, or Josephson parametric converters, etc.).

The RF control signal generators 720 generate microwave signals that are transmitted over a plurality of high-bandwidth RF control lines 722 from the RT environment to the signal switching circuitry 740 in the cryogenic environment. As schematically illustrated in FIG. 7, the high-bandwidth RF control lines 722 comprise a first high-bandwidth transmission line 722-1 to transmit microwave control signals (generated by the RF control signal generators 720) to the first port $P_1$ of the first switch circuit 740-1, and a second high-bandwidth transmission line 722-2 to transmit microwave control signals (generated by the RF control signal generators 720) to the fifth port $P_5$ of the second switch circuit 740-2.

The flux bias control signal generators 730 are configured to generate flux bias control signals (e.g., DC signals, baseband pulses, etc.) which are applied to the signal switching circuitry 740 by a plurality of flux bias control lines 732. In some embodiments, flux bias control signal generators 730 represent the flux signal generators 120 and/or 220 as shown in FIGS. 1A, 2A, 2B, 3, 4, and 5, which generate flux bias control signals (e.g., Flux_A, Flux_B, Flux_C, Flux_D, Flux_E, Flux_F, Flux_G) that are selectively applied to the signal switching circuitry 740. In some embodiments, each flux bias control line 732 is commonly coupled to, and shared by, the first and second switch circuits 740-1 and 740-2 (e.g., based on the control line network architecture schematically shown in FIG. 2A). In some embodiments, only a subset of the flux bias control lines 732 is commonly coupled to, and shared by, the first and second switch circuits 740-1 and 740-2, while other flux bias control lines are independently coupled to (and not shared by) the first and second switch circuits 740-1 and 740-2 (e.g., based on the control line network architecture schematically shown in FIG. 2B).

The time-domain multiplexing control system 710 implements a control process to control and synchronize the operations of the RF control signal generators 720 and the flux bias control signal generators 730 to synchronize the generation and output of microwave control signals on the high-bandwidth control lines 722, in conjunction with the selective generation and output of flux bias control signals on the flux bias control lines 732, to thereby selectively route microwave signals, which are input to the signal switching circuitry 740, to target quantum devices of the plurality of quantum devices 750-755 coupled to the I/O ports of the first and second switch circuits 740-1 and 740-2. In particular, a microwave control signal applied to the port $P_1$ of the first switch circuit 740-1 can be selectively routed to a target one of the quantum devices 750, 751, or 752 by controlling the first switch circuit 740-1 to configure a signal routing path from the port $P_1$ to one of the other ports $P_2$, $P_3$, or $P_4$ which is coupled to the target quantum device 750, 751, or 752. Similarly, a microwave control signal applied to the port $P_5$ of the second switch circuit 740-2 can be selectively routed to a target one of the quantum devices 753, 754, or 755 by controlling the second switch device 740-2 to configure a signal routing path from the port $P_5$ to one of the other ports $P_6$, $P_7$, or $P_8$ which is coupled to the target quantum device 753, 754, or 755. It is to be noted that while FIG. 7 illustrates the signal switching circuitry 740 having two switch circuits 740-1 and 740-2, as noted above, the signal switching circuitry 740 can have, e.g., tens or hundreds of instances of a 4-way switch circuit to enable routing of control signals to a large number of quantum devices.

It is to be appreciated that the exemplary superconducting signal switching circuitry and superconducting all-to-all switch circuits as described herein provide fast switching speeds (e.g., nanosecond switching speeds) with extremely low and substantially zero power dissipation for switching between different channels, while providing all-to-all connectivity to successfully route signals to and from control and readout electronics and the quantum processors. Indeed, the use of flux bias signals on superconducting flux bias lines to selectively activate/deactivate Josephson junction-based switch nodes of a switch device, allows different paths through the switch device to be selectively configured for microwave transmission between any pairwise combination of signal I/O of the switch device. The ability to route RF signals from a myriad of inputs to a myriad of outputs in an all-to-all connectivity scheme allows for greater multiplexing of cables that can significantly reduce the number of high bandwidth wires that need to be implemented for transmission signals from room temperature (e.g., 300K) electronics to quantum devices in a cryogenic environment (e.g., mK stage) of a dilution refrigerator.

Moreover, while FIG. 7 illustrates an exemplary embodiment in which superconducting switch circuitry can be implemented to route high-bandwidth signals (e.g., RF control pulses) from room temperature electronics to quantum devices, it is be appreciated that superconducting switch circuitry can be utilized to implement multiplexing of a signal, whereby multiple inputs can be routed to a single common output line. For example, with a 4-port all-to-all switch circuit, three different qubit readout signal chains can be coupled to three different ports of the 4-port all-to-all switch circuit, wherein the 4-port all-to-all switch circuit is controlled using the same techniques as described herein to route different amplified qubit readout signals from the three different readout chains, to a single output port that is coupled to a common output line which transmits the amplified readout signals to RT readout electronics (e.g., down conversion and analog-to-digital converter (ADC) circuitry). In this regard, an all-to-all switch circuit can be used for demultiplexing and multiplexing applications.

Figure 8:
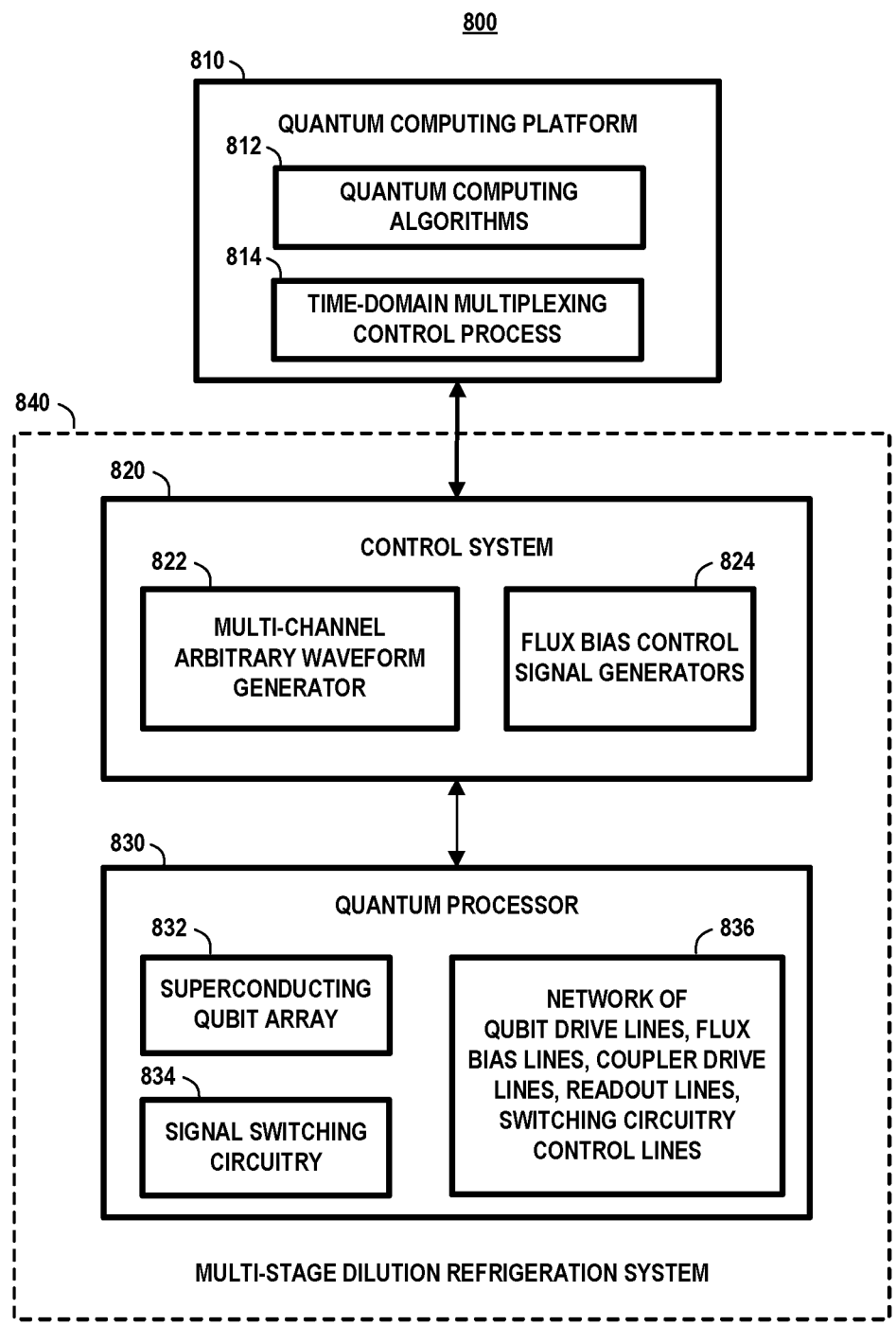
FIG. 8 schematically illustrates a quantum computing system which comprises signal switching circuitry, according to another exemplary embodiment of the disclosure.

FIG. 8 schematically illustrates a quantum computing system which comprises signal switching circuitry, according to another exemplary embodiment of the disclosure. FIG. 8 schematically illustrates a quantum computing system 800 which comprises a quantum computing platform 810, a control system 820, and a quantum processor 830. In some embodiments, the quantum computing platform 810 implements a software platform that is configured to program a quantum computer to execute quantum computing algorithms 812 which are implemented using, e.g., quantum circuits which define computational routings consisting of coherent quantum operations on quantum data, such as qubits. In addition, in some embodiments, the quantum computing platform 810 implements software control programs for implementing a time-domain multiplexing control process which implements time-domain multiplexing control protocols 814 to generate synchronize the generation of microwave control signals and the routing of the microwave control signals using switching circuitry, as discussed herein.

In addition, in some embodiments, the control system 820 comprises a multi-channel arbitrary waveform generator (AWG) 822, and flux bias control signal generators 824. The quantum processor 830 comprises one or more solid-state quantum chips which comprise, e.g., a superconducting qubit array 832, signal switching circuitry 834, and a network 836 of qubit drive lines, coupler flux-bias control lines, qubit state readout lines, and switching circuitry control lines, and other circuit QED components that may be needed for a given application or quantum system configuration. The signal switching circuitry 834 can be implemented using any of the exemplary embodiments as discussed herein (e.g., FIGS. 1A, 2A, 2B, 3, 4, and 5).

In some embodiments, the control system 820 and the quantum processor 830 are disposed different stages of a dilution refrigeration system 840 which can generate cryogenic temperatures that are sufficient to operate components of the control system 820 for quantum computing applications. For example, the quantum processor 830 may need to be cooled down to near-absolute zero, e.g., 10-15 millikelvin (mK), to allow the superconducting qubits to exhibit quantum behaviors. In some embodiments, the dilution refrigeration system 840 comprises a multi-stage dilution refrigerator where the components of the control system 820 can be maintained at different cryogenic temperatures, as needed. For example, while the quantum processor 830 may need to be cooled down to, e.g., 10-15 mK, the circuit components of the control system 820 may be operated at cryogenic temperatures greater than 10-15 mK (e.g., cryogenic temperatures in a range of 3K-4K), depending on the configuration of the quantum computing system. In some embodiments, the entirety of the control system 820, or some components thereof, are disposed in a room temperature environment, such as discussed above in conjunction with FIG. 7.

In some embodiments, the superconducting qubit array 832 comprises a quantum system of superconducting qubits, superconducting qubit couplers, and other components commonly utilized to support quantum processing using qubits. The number of superconducting qubits of the superconducting qubit array 832 can be on the order of tens, hundreds, thousands, or more, etc. The network 836 of qubit drive lines, coupler flux bias control lines, and qubit state readout lines, etc., is configured to apply microwave control signals to superconducting qubits and coupler circuitry in the superconducting qubit array 832 to perform various types of gate operations, e.g., single-gate operations, entanglement gate operations, perform error correction operations, etc., as well as read the quantum states of the superconducting qubits. In some embodiments, the qubit drive lines of the superconducting qubits are coupled to the signal switching circuitry 834, wherein the signal switching circuitry 834 is configured to receive microwave control signals from the multi-channel arbitrary waveform generator 822 and selectively route the microwave control signals to targe qubits, in response to flux bias control signals applied by the flux bias control signal generators 824. For example, microwave control pulses can be selectively applied to the qubit drive lines of respective superconducting qubits to change the quantum state of the superconducting qubits (e.g., change the quantum state of a given qubit between the ground state and excited state, or to a superposition state) when executing quantum information processing algorithms.

The network 836 of qubit drive lines, coupler flux bias control lines, qubit state readout lines, and switching circuitry control lines, etc., is coupled to the control system 820 through a suitable hardware input/output (I/O) interface, which couples I/O signals between the control system 820 and the quantum processor 830. For example, the hardware I/O interface may comprise various types of hardware and components, such as RF cables, wiring, RF elements, optical fibers, heat exchanges, filters, amplifiers, isolators, etc.

In some embodiments, the multi-channel AWG 822 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 822 comprises a plurality of AWG channels, which control respective superconducting qubits within the superconducting qubit array 832 of the quantum processor 830. In some embodiments, each AWG channel comprises a baseband signal generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 822 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

The quantum computing platform 810 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 810 comprises a hardware architecture of processors, memory, etc., which is configured to control the execution of quantum applications, and interface with the control system 820 to (i) generate digital control signals that are converted to analog microwave control signals by the control system 820, to control operations of the quantum processor 830 when executing a given quantum application, and (ii) to obtain and process digital signals received from the control system 820, which represent the processing results generated by the quantum processor 830 when executing various gate operations for a given quantum application.

Figure 9:
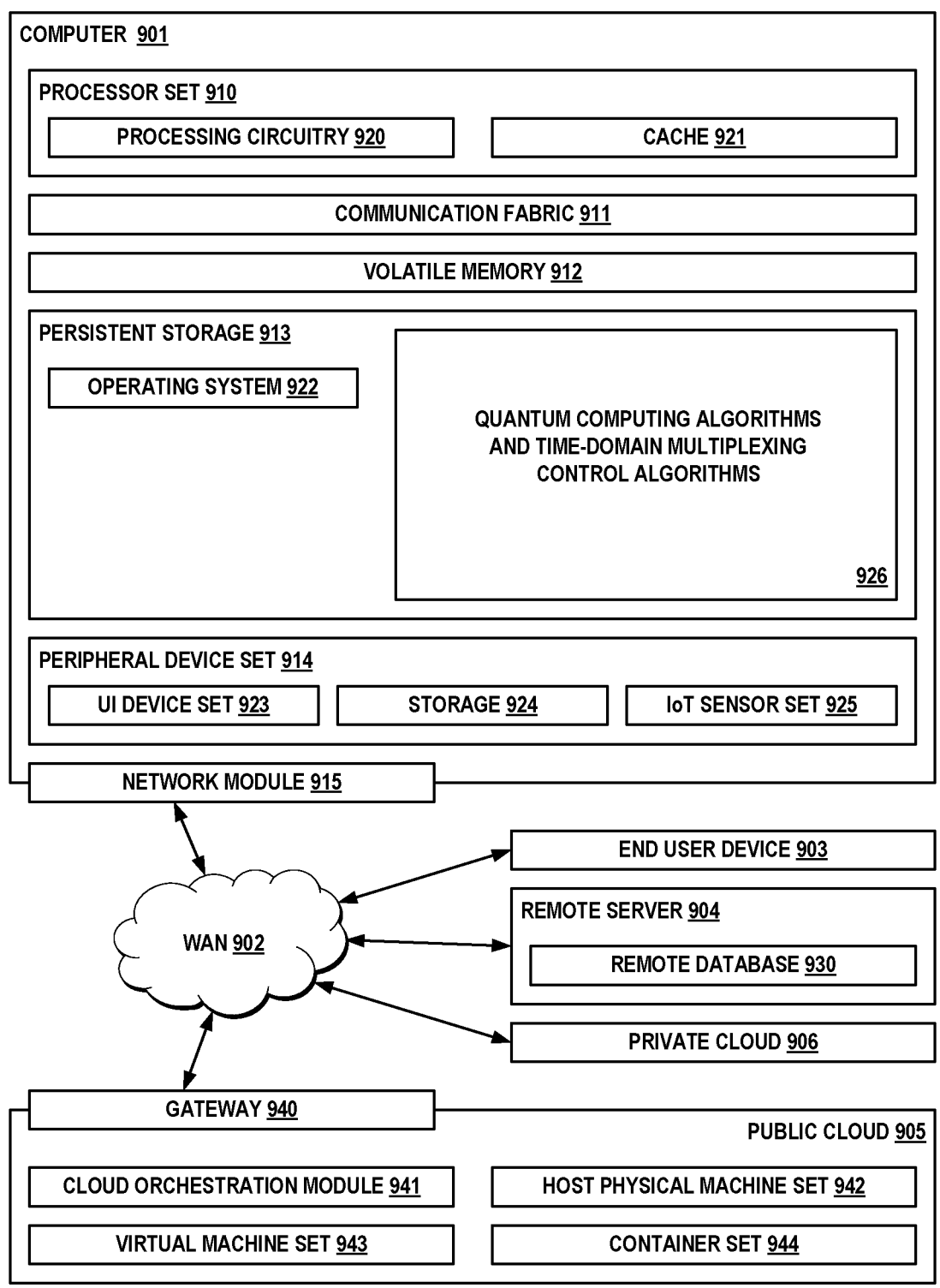
FIG. 9 schematically illustrates an exemplary architecture of a computing environment for hosting a quantum computing platform, according to an exemplary embodiment of the disclosure.

In some exemplary embodiments, the quantum computing platform 810 of the quantum computing system 800 may be implemented using any suitable computing system architecture (e.g., as shown in FIG. 9) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 900 of FIG. 9 contains an example of an environment for the execution of at least some of the computer code (block 926) involved in executing quantum computing algorithms (e.g., quantum computing algorithms 812, and time-domain multiplexing control processes 814, FIG. 8). In addition to block 926, computing environment 900 includes, for example, computer 901, wide area network (WAN) 902, end user device (EUD) 903, remote server 904, public cloud 905, and private cloud 906. In this embodiment, computer 901 includes processor set 910 (including processing circuitry 920 and cache 921), communication fabric 911, volatile memory 912, persistent storage 913 (including operating system 922 and block 926, as identified above), peripheral device set 914 (including user interface (UI), device set 923, storage 924, and Internet of Things (IoT) sensor set 925), and network module 915. Remote server 904 includes remote database 930. Public cloud 905 includes gateway 940, cloud orchestration module 941, host physical machine set 942, virtual machine set 943, and container set 944.

Computer 901 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 930. As is well understood in the art of computer technology, and depending upon the technology, performance of a computer-implemented method may be distributed among multiple computers and/or between multiple locations. On the other hand, in this presentation of computing environment 900, detailed discussion is focused on a single computer, specifically computer 901, to keep the presentation as simple as possible. Computer 901 may be located in a cloud, even though it is not shown in a cloud in FIG. 9. On the other hand, computer 901 is not required to be in a cloud except to any extent as may be affirmatively indicated.

Processor set 910 includes one, or more, computer processors of any type now known or to be developed in the future. Processing circuitry 920 may be distributed over multiple packages, for example, multiple, coordinated integrated circuit chips. Processing circuitry 920 may implement multiple processor threads and/or multiple processor cores. Cache 921 is memory that is located in the processor chip package(s) and is typically used for data or code that should be available for rapid access by the threads or cores running on processor set 910. Cache memories are typically organized into multiple levels depending upon relative proximity to the processing circuitry. Alternatively, some, or all, of the cache for the processor set may be located "off chip." In some computing environments, processor set 910 may be designed for working with qubits and performing quantum computing.

Computer readable program instructions are typically loaded onto computer 901 to cause a series of operational steps to be performed by processor set 910 of computer 901 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 921 and the other storage media discussed below. The program instructions, and associated data, are accessed by processor set 910 to control and direct performance of the inventive methods. In computing environment 900, at least some of the instructions for performing the inventive methods may be stored in block 926 in persistent storage 913.

Communication fabric 911 is the signal conduction paths that allow the various components of computer 901 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 912 is any type of volatile memory now known or to be developed in the future. Examples include dynamic type random access memory (RAM) or static type RAM. Typically, the volatile memory is characterized by random access, but this is not required unless affirmatively indicated. In computer 901, the volatile memory 912 is located in a single package and is internal to computer 901, but, alternatively or additionally, the volatile memory may be distributed over multiple packages and/or located externally with respect to computer 901.

Persistent storage 913 is any form of non-volatile storage for computers that is now known or to be developed in the future. The non-volatility of this storage means that the stored data is maintained regardless of whether power is being supplied to computer 901 and/or directly to persistent storage 913. Persistent storage 913 may be a read only memory (ROM), but typically at least a portion of the persistent storage allows writing of data, deletion of data and re-writing of data. Some familiar forms of persistent storage include magnetic disks and solid-state storage devices. Operating system 922 may take several forms, such as various known proprietary operating systems or open source Portable Operating System Interface type operating systems that employ a kernel. The code included in block 926 typically includes at least some of the computer code involved in performing the inventive methods.

Peripheral device set 914 includes the set of peripheral devices of computer 901. Data communication connections between the peripheral devices and the other components of computer 901 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 923 may include components such as a display screen, speaker, microphone, wearable devices (such as goggles and smart watches), keyboard, mouse, printer, touchpad, game controllers, and haptic devices. Storage 924 is external storage, such as an external hard drive, or insertable storage, such as an SD card. Storage 924 may be persistent and/or volatile. In some embodiments, storage 924 may take the form of a quantum computing storage device for storing data in the form of qubits. In embodiments where computer 901 is required to have a large amount of storage (for example, where computer 901 locally stores and manages a large database) then this storage may be provided by peripheral storage devices designed for storing very large amounts of data, such as a storage area network (SAN) that is shared by multiple, geographically distributed computers. IoT sensor set 925 is made up of sensors that can be used in Internet of Things applications. For example, one sensor may be a thermometer and another sensor may be a motion detector.

Network module 915 is the collection of computer software, hardware, and firmware that allows computer 901 to communicate with other computers through WAN 902. Network module 915 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 915 are performed on the same physical hardware device. In other embodiments (for example, embodiments that utilize software-defined networking (SDN)), the control functions and the forwarding functions of network module 915 are performed on physically separate devices, such that the control functions manage several different network hardware devices. Computer readable program instructions for performing the inventive methods can typically be downloaded to computer 901 from an external computer or external storage device through a network adapter card or network interface included in network module 915.

WAN 902 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 903 is any computer system that is used and controlled by an end user (for example, a customer of an enterprise that operates computer 901), and may take any of the forms discussed above in connection with computer 901. EUD 903 typically receives helpful and useful data from the operations of computer 901. For example, in a hypothetical case where computer 901 is designed to provide a recommendation to an end user, this recommendation would typically be communicated from network module 915 of computer 901 through WAN 902 to EUD 903. In this way, EUD 903 can display, or otherwise present, the recommendation to an end user. In some embodiments, EUD 903 may be a client device, such as thin client, heavy client, mainframe computer, desktop computer and so on.

Remote server 904 is any computer system that serves at least some data and/or functionality to computer 901. Remote server 904 may be controlled and used by the same entity that operates computer 901. Remote server 904 represents the machine(s) that collect and store helpful and useful data for use by other computers, such as computer 901. For example, in a hypothetical case where computer 901 is designed and programmed to provide a recommendation based on historical data, then this historical data may be provided to computer 901 from remote database 930 of remote server 904.

Public cloud 905 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 905 is performed by the computer hardware and/or software of cloud orchestration module 941. The computing resources provided by public cloud 905 are typically implemented by virtual computing environments that run on various computers making up the computers of host physical machine set 942, which is the universe of physical computers in and/or available to public cloud 905. The virtual computing environments (VCEs) typically take the form of virtual machines from virtual machine set 943 and/or containers from container set 944. It is understood that these VCEs may be stored as images and may be transferred among and between the various physical machine hosts, either as images or after instantiation of the VCE. Cloud orchestration module 941 manages the transfer and storage of images, deploys new instantiations of VCEs and manages active instantiations of VCE deployments. Gateway 940 is the collection of computer software, hardware, and firmware that allows public cloud 905 to communicate through WAN 902.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 906 is similar to public cloud 905, except that the computing resources are only available for use by a single enterprise. While private cloud 906 is depicted as being in communication with WAN 902, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 905 and private cloud 906 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a switch circuit comprising a plurality of signal input/output ports, and a plurality of switch nodes, each switch node comprising a superconducting loop which comprises a plurality of Josephson junctions arranged in a ring configuration; and
    control lines configured to selectively apply flux bias control signals to the switch nodes;
    wherein the plurality of switch nodes is arranged to selectively configure a signal routing path between any pairwise combination of signal input/output ports of the plurality of signal input/output ports, in response to flux bias control signals selectively applied to the switch nodes.

2. The device of claim 1, wherein:
    the plurality of signal input/output ports comprises a first port, a second port, a third port, and a fourth port; and
    the plurality of switch nodes comprises a first switch node, a second switch node, a third switch node, a fourth switch node, and a fifth switch node, which are coupled in an all-to-all switch matrix configuration.

3. The device of claim 2, wherein:
    the first switch node and the second switch node are serially coupled in a first signal routing path between the first port and the second port;
    the first switch node, the fifth switch node, and the third switch node are serially coupled in a second signal between the first port and the third port;
    the first switch node and the fourth switch node are serially coupled in a third signal path between the first port and the fourth port;
    the second switch node and the third switch node are serially coupled in fourth signal routing path between the second port and the third port;
    the second switch node, the fifth switch node, and the fourth switch node are serially coupled in a fifth signal routing path between the second port and the fourth port; and
    the third switch node and the fourth switch node are serially coupled in sixth signal routing path between the third switch node and the fourth switch node.

4. The device of claim 1, wherein:
    at least one switch node is coupled to a first control line and coupled to a second control line;
    the first control line is configured to apply a first flux bias control signal to the at least one switch node which causes a magnetic flux to thread through the superconducting loop of the at least one switch node in a first direction; and
    the second control line is configured to apply a second flux bias control signal to the at least one switch node which causes a magnetic flux to thread through the superconducting loop of the at least one switch node in a second direction opposite to the first direction.

5. The device of claim 1, wherein:
    each switch node is configured to be placed into one of a first state and a second state, in response to the flux bias control signals selectively applied to the switch nodes;
    in the first state, a given switch node is configured to enable a transmission of a microwave signal along a signal path through the given switch node;
    in the second state, the given switch node is configured to block the transmission of the microwave signal along the signal path though the given switch node.

6. The device of claim 1, further comprising an impedance matching network integrated with the switch circuit.

7. The device of claim 6, wherein the impedance matching network comprises a plurality of immittance inverting multipole bandpass filters, wherein each immittance inverting multipole bandpass filter is disposed in a respective signal routing path between a respective pairwise combination of the signal input/output ports.

8. The device of claim 6, wherein the impedance matching network is configured to match an impedance between each pairwise combination of the signal input/output ports where impedances at the signal input/output ports are nominally identical.

9. The device of claim 6, wherein the impedance matching network is configured to match an impedance between each pairwise combination of the signal input/output ports where impedances at the signal input/output ports are dissimilar.

10. A device, comprising:
    a plurality of switch circuits; and
    a plurality of control lines coupled to the switch circuits, wherein at least a subset of the control lines is commonly coupled to each switch circuit of the plurality of switch circuits;
    wherein each switch circuit comprises a plurality of signal input/output ports, and a plurality of switch nodes, each switch node comprising a superconducting loop which comprises a plurality of Josephson junctions arranged in a ring configuration, wherein the plurality of switch nodes is arranged to selectively configure a signal routing path between any pairwise combination of signal input/output ports of the plurality of signal input/output ports, in response to flux bias control signals selectively applied to the switch nodes by the control lines.

11. The device of claim 10, wherein each control line of the subset of the control lines is coupled to at least one switch node in each switch circuit.

12. The device of claim 10, wherein each control line of the plurality of control lines is coupled to each switch circuit of the plurality of switch circuits.

13. The device of claim 10, wherein:
the plurality of signal input/output ports of each switch circuit comprises a first port, a second port, a third port, and a fourth port; and
the plurality of switch nodes of each switch circuit comprises a first switch node, a second switch node, a third switch node, a fourth switch node, and a fifth switch node, which are coupled in an all-to-all switch matrix configuration.

14. A system, comprising:
a quantum processor comprising superconducting quantum devices;
a switch circuit coupled to at least some of the superconducting quantum devices; and
a control system which is coupled to the switch circuit by control lines, and configured to control operation of the switch circuit to route a microwave signal to a given superconducting quantum device coupled to the switch circuit;
wherein the switch circuit comprises a plurality of signal input/output ports, and a plurality of switch nodes, each switch node comprising a superconducting loop which comprises a plurality of Josephson junctions arranged in a ring configuration, wherein the plurality of switch nodes is arranged to selectively configure a signal routing path between any pairwise combination of signal input/output ports of the plurality of signal input/output ports, in response to flux bias control signals on the control lines, which are selectively applied to the switch nodes by the control system.

15. The system of claim 14, wherein the switch circuit is coupled to superconducting quantum bits on the quantum processor.

16. The system of claim 14, wherein:
the plurality of signal input/output ports of the switch circuit comprises a first port, a second port, a third port, and a fourth port;
the plurality of switch nodes of the switch circuit comprises a first switch node, a second switch node, a third switch node, a fourth switch node, and a fifth switch node;
the first port is configured to receive a microwave control signal;
the second port, the third port, and the fourth port are each coupled to a respective one of the superconducting quantum devices; and
the control system is configured implement a time-domain multiplexing control process to selectively generate flux bias control signals on the control lines to configure the switch nodes of the switch circuit to configure a signal routing path through the switch circuit to route a microwave signal applied to the first port to one of the second port, the third port, and the fourth port, to thereby selectively apply the microwave signal to a target superconducting quantum device.

17. The system of claim 14, wherein:
at least one switch node of the switch circuit is coupled to a first control line and coupled to a second control line;
the first control line is configured to apply a first flux bias control signal to the at least one switch node which causes a magnetic flux to thread through the superconducting loop of the at least one switch node in a first direction; and
the second control line is configured to apply a second flux bias control signal to the at least one switch node which causes a magnetic flux to thread through the superconducting loop of the at least one switch node in a second direction opposite to the first direction.

18. The system of claim 14, wherein:
each switch node of the switch circuit is configured to be placed into one of a first state and a second state, in response to the flux bias control signals selectively applied to the switch nodes by the control system;
in the first state, a given switch node is configured to enable a transmission of a microwave signal along a signal path through the given switch node;
in the second state, the given switch node is configured to block the transmission of the microwave signal along the signal path though the given switch node.

19. The system of claim 14, wherein the switch circuit is integrated with an impedance matching network.

20. The system of claim 19, wherein the impedance matching network comprises a plurality of immittance inverting multipole bandpass filters, wherein each immittance inverting multipole bandpass filter is disposed in a respective signal routing path between a respective pairwise combination of the signal input/output ports.

* * * * *